(12) United States Patent
Arekar

(10) Patent No.: US 10,079,442 B2
(45) Date of Patent: Sep. 18, 2018

(54) TRANSCEIVER AND MECHANISM FOR RECEIVING THE SAME

(71) Applicant: FOXCONN INTERCONNECT TECHNOLOGY LIMITED, Grand Cayman (KY)

(72) Inventor: Chaitanya Arekar, Dubun, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/407,188

(22) Filed: Jan. 16, 2017

(65) Prior Publication Data

US 2018/0205164 A1   Jul. 19, 2018

(51) Int. Cl.
| | |
|---|---|
| H01R 13/648 | (2006.01) |
| H01R 12/70 | (2011.01) |
| H01R 24/62 | (2011.01) |
| H05K 7/18 | (2006.01) |
| H01R 13/629 | (2006.01) |
| H05K 1/11 | (2006.01) |
| H01R 43/20 | (2006.01) |
| H01R 107/00 | (2006.01) |

(52) U.S. Cl.
CPC ... *H01R 12/7058* (2013.01); *H01R 13/62911* (2013.01); *H01R 24/62* (2013.01); *H01R 43/205* (2013.01); *H05K 1/117* (2013.01); *H05K 7/183* (2013.01); *H01R 2107/00* (2013.01)

(58) Field of Classification Search
CPC .. H01R 2107/00; H01R 43/205; H01R 24/62; H01R 13/62911; H01R 12/7058; H05K 7/183; H05K 1/117
USPC ................. 439/78, 131, 362, 607.2, 607.21
See application file for complete search history.

(56) References Cited

U.S. PATENT DOCUMENTS

| | | | | |
|---|---|---|---|---|
| 5,342,216 A * | 8/1994 | Davis | ............... | H01R 13/65802 439/362 |
| 6,142,802 A | 11/2000 | Berg et al. | | |
| 6,517,382 B2 | 2/2003 | Tyco | | |
| 6,575,770 B2 | 6/2003 | Agilent | | |
| 6,893,294 B2 * | 5/2005 | Moriyama | ........... | G02B 6/4201 439/607.2 |
| 7,001,217 B2 * | 2/2006 | Bright | .................. | G02B 6/4201 439/607.2 |
| 7,285,005 B2 * | 10/2007 | Gabrielsson | ....... | H01R 13/6278 439/362 |
| 7,470,139 B2 * | 12/2008 | Miki | ....................... | H04B 1/38 439/354 |

(Continued)

*Primary Examiner* — Abdullah Riyami
*Assistant Examiner* — Nelson R Burgos-Guntin
(74) *Attorney, Agent, or Firm* — Ming Chieh Chang; Wei Te Chung

(57) ABSTRACT

A mechanism (100) mounted on a printed circuit board for insertion of a transceiver, includes a frame structure; a pair of lead screws (30) mounted on and turnable with respect to the frame structure; a pair of cam units each coupled to a corresponding lead screw, the cam unit being actuatable by a turning movement of the lead screw; and a rail follower (50) disposed between the pair of cam units and confined to the frame structure, the rail follower having a receiving room for inserting the transceiver along a first direction, the rail follower being movable by the cam units actuated by the lead screws to move along a second direction perpendicular to the first direction.

20 Claims, 24 Drawing Sheets

(56) References Cited

U.S. PATENT DOCUMENTS

| | | | | |
|---|---|---|---|---|
| 7,780,361 B2* | 8/2010 | Harris | ............... | G02B 6/4246 |
| | | | | 361/697 |
| 7,914,317 B2* | 3/2011 | Pirillis | ............... | H05K 5/0204 |
| | | | | 439/372 |
| 7,928,324 B2* | 4/2011 | Moore | ............... | G02B 6/4246 |
| | | | | 174/354 |
| 8,129,630 B2* | 3/2012 | Moore | ............... | G02B 6/4201 |
| | | | | 174/384 |
| 8,535,096 B1* | 9/2013 | Shirk | ............... | H01R 13/648 |
| | | | | 439/374 |
| 8,556,658 B2* | 10/2013 | Szczesny | ........... | H01R 13/6582 |
| | | | | 361/704 |
| 8,622,770 B2* | 1/2014 | Teo | ............... | G02B 6/4277 |
| | | | | 439/607.2 |
| 8,747,159 B2* | 6/2014 | Liu | ............... | G02B 6/428 |
| | | | | 439/607.2 |
| 8,890,004 B2* | 11/2014 | Wickes | ............ | H01R 13/6583 |
| | | | | 174/354 |
| 9,048,585 B2 | 6/2015 | Foxconn | | |
| 9,423,579 B2 | 8/2016 | Finisar | | |
| 2002/0001989 A1* | 1/2002 | Friesen | ............ | H01R 13/6215 |
| | | | | 439/362 |
| 2002/0072274 A1* | 6/2002 | Flickinger | ........ | H01R 13/65802 |
| | | | | 439/607.2 |
| 2004/0102076 A1* | 5/2004 | Wu | ............... | H01R 13/6215 |
| | | | | 439/362 |
| 2004/0203289 A1* | 10/2004 | Ice | ............... | G02B 6/4277 |
| | | | | 439/607.2 |
| 2006/0116084 A1* | 6/2006 | Miki | ............ | H04B 1/38 |
| | | | | 455/90.3 |
| 2006/0252311 A1* | 11/2006 | Togami | ............ | G02B 6/4277 |
| | | | | 439/607.2 |

* cited by examiner

TRANSCEIVER AND MECHANISM FOR RECEIVING THE SAME

BACKGROUND OF THE INVENTION

1. Field of the Invention

The present invention relates to mechanism and method for assembling the same, and more particularly to a mechanism and method for assembling the same for receiving a transceivers.

2. Description of Related Arts

Traditionally, transceivers have PCB with gold fingers at the rear end. The transceiver gets connected to the host board by plugging PCB gold finger into the host edge connector. This allows transceiver to be inserted horizontally or along the axis of insertion. With horizontal plug-in transceivers, the numbers of connections to the host board are limited to the number of gold fingers on the PCB and also to the number of host board connectors (generally copper). With increased data speed requirements, the copper connectors are reaching their design limits in terms of signal integrity. To achieve higher interconnect density, another method of connecting transceiver to the host board needs to be found. For a given transceiver, more connections to the PCB board can be made if the connections to the host board can be done along the belly of the transceiver. There are two ways to connect the transceiver to the PCB board in the belly format—a) BGA connectors and b) LGA connectors.

U.S. Pat. No. 9,423,579, issued to Koutrokois on Aug. 23, 2016, discloses a transceiver for being horizontally plugged into a cage to electrically connect with a host board connector. U.S. Pat. No. 9,048,585, issued to Lin et al. on Jun. 2, 2015, discloses an electrical connector assembly comprising a shielding housing, a socket, and a buckle assembled to the shielding housing. The shielding housing has a horizontal passage and an entrance backwardly communicating the passage and forwardly opening for receiving a plug. The socket is used for mating with a front end of a plug inserted therein. The buckle has a front latch movable between an open position where a plug inside the shielding housing is permitted to be pulled out and a closed position where the front latch blocks the entrance of the shielding housing so that a plug inside the shielding housing is blocked from being pulled out.

SUMMARY OF THE INVENTION

An object of the present invention is to provide a mechanism that is easy to increase interconnect density.

To achieve the above-mentioned object, a mechanism mounted on a printed circuit board for insertion of a transceiver, comprises a frame structure; a pair of lead screws mounted on and turnable with respect to the frame structure; a pair of cam units each coupled to a corresponding lead screw, the cam unit being actuatable by a turning movement of the lead screw; and a rail follower disposed between the pair of cam units and confined to the frame structure, the rail follower having a receiving room for inserting the transceiver along a first direction, the rail follower being movable by the cam units actuated by the lead screws to move along a second direction perpendicular to the first direction.

According to the present invention, the mechanism take the transceiver electrically connected with the printed circuit board along a second direction perpendicular to the first direction which could be easy to increase interconnect density.

Another object of the present invention is to provide a method for connecting a transceiver to a printed circuit board that is easy to increase interconnect density.

To achieve the above-mentioned object, A method for connecting a transceiver to a printed circuit board (PCB), comprises the steps of providing a mechanism comprising a frame structure and a rail follower actuatable to move relative to the frame structure toward the PCB, the rail follower having a receiving room; mounting the mechanism on the PCB; providing a transceiver comprising an electrical connector at a surface thereof proximal to the PCB; plugging the transceiver into the receiving room along a direction parallel to the PCB; and driving the mechanism to make the rail follower together with the transceiver to move toward the PCB and to make the connector electrically connected with the PCB.

According to the present invention, the method could be easy to increase interconnect density.

Another object of the present invention is to provide a transceiver system that is easy to increase interconnect density.

To achieve the above-mentioned object, a transceiver system comprises a mechanism mounted on a printed circuit board (PCB), the mechanism comprising a frame structure and a rail follower actuatable to move relative to the frame structure toward the PCB, the rail follower having a receiving room; and a transceiver receivable along a direction parallel to the PCB in the receiving room to be movable together with the rail follower, the transceiver comprising an electrical connector at a surface thereof proximal to the PCB.

According to the present invention, the transceiver system could be easy to increase interconnect density.

Another object of the present invention is to provide a transceiver that is easy to increase interconnect density.

To achieve the above-mentioned object, a transceiver for electrically connecting to conductive pads of a host circuit board, comprises a housing structure having a head portion and a body portion, the heading portion having a connector interfacing opening, the body portion having a pair of guiding features on two opposite sides thereof; an electrical connector mounted to the body portion; and a module circuit board disposed inside the housing and electrically connected to the electrical connector.

According to the present invention, the transceiver could be easy to increase interconnect density.

DETAILED DESCRIPTION OF THE PREFERRED EMBODIMENT

Figure 1:
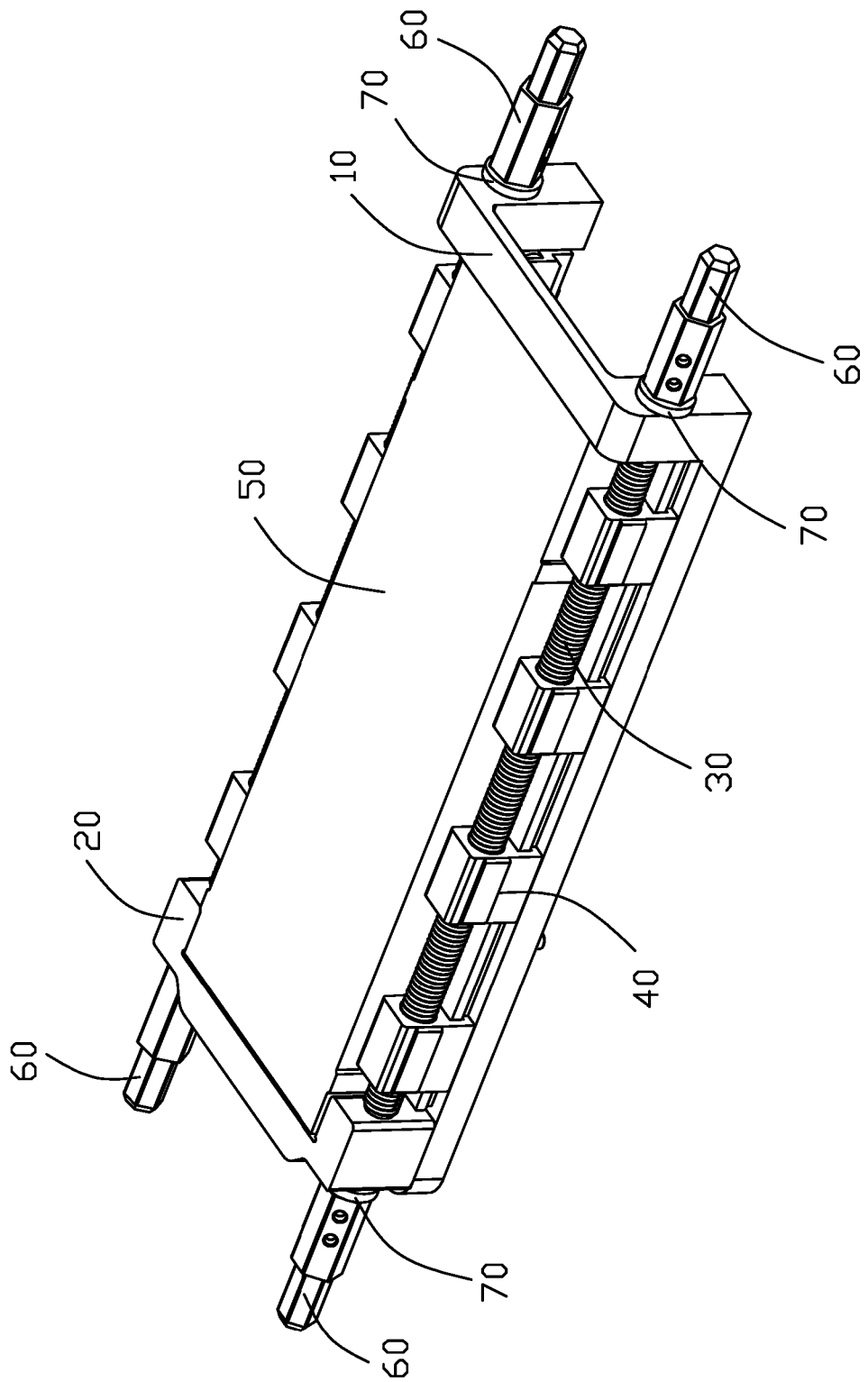
FIG. 1 is a perspective view of a mechanism in accordance with present invention.
Figure 2:
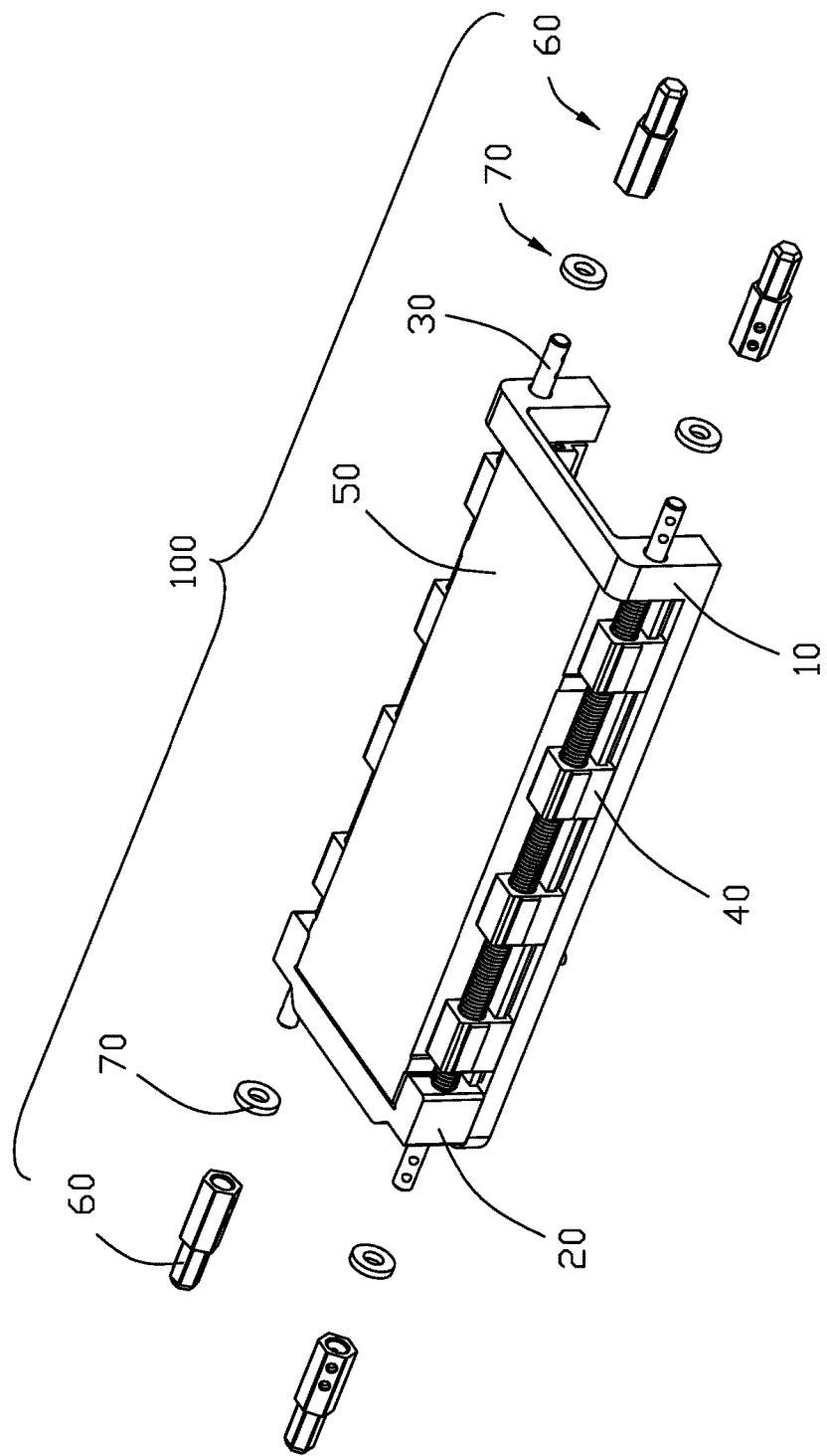
FIG. 2 is a partly exploded view of the mechanism as shown in FIG. 1.
Figure 3:
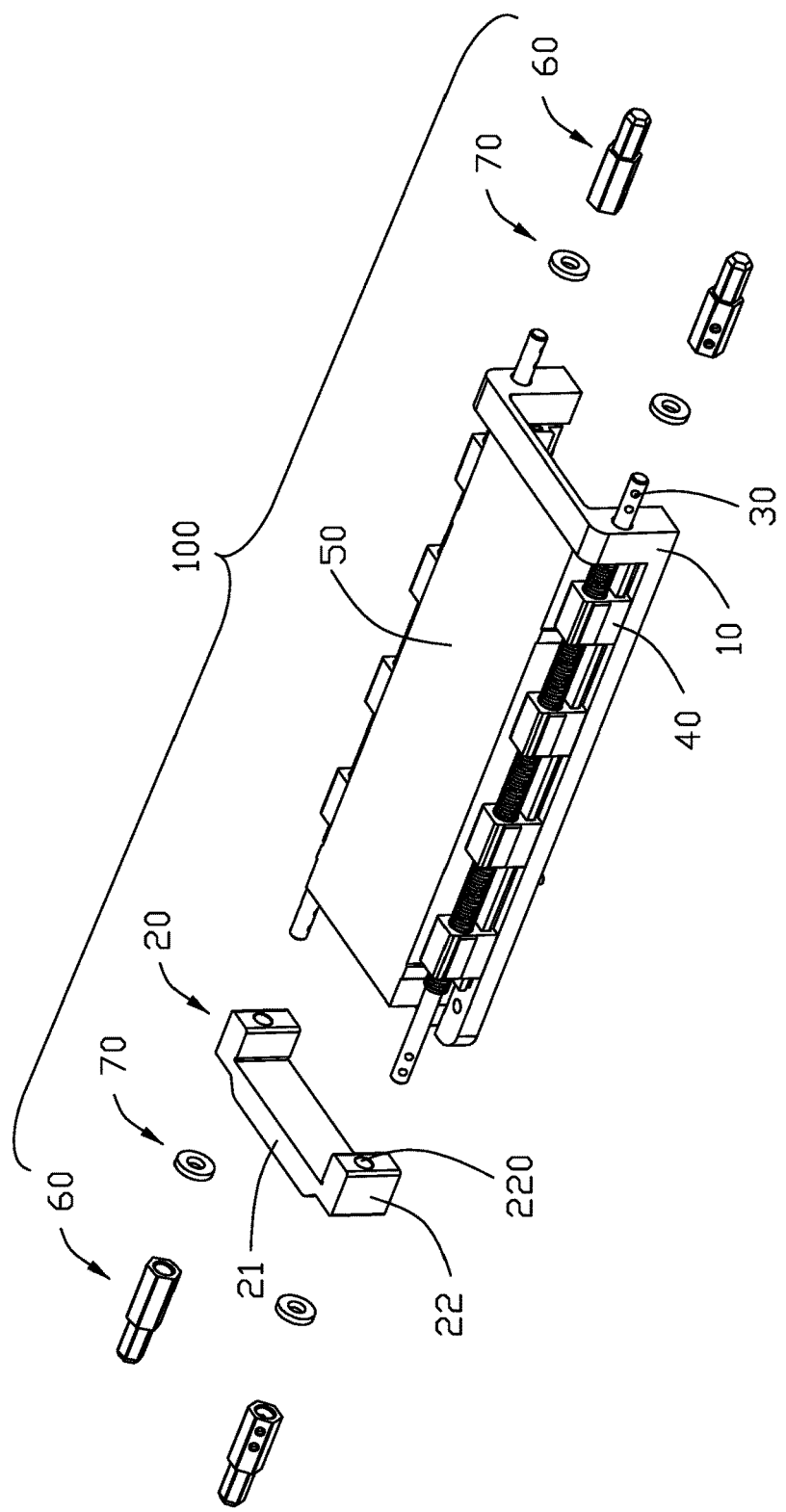
FIG. 3 is a further partly exploded view of the mechanism as shown in FIG. 2.
Figure 4:
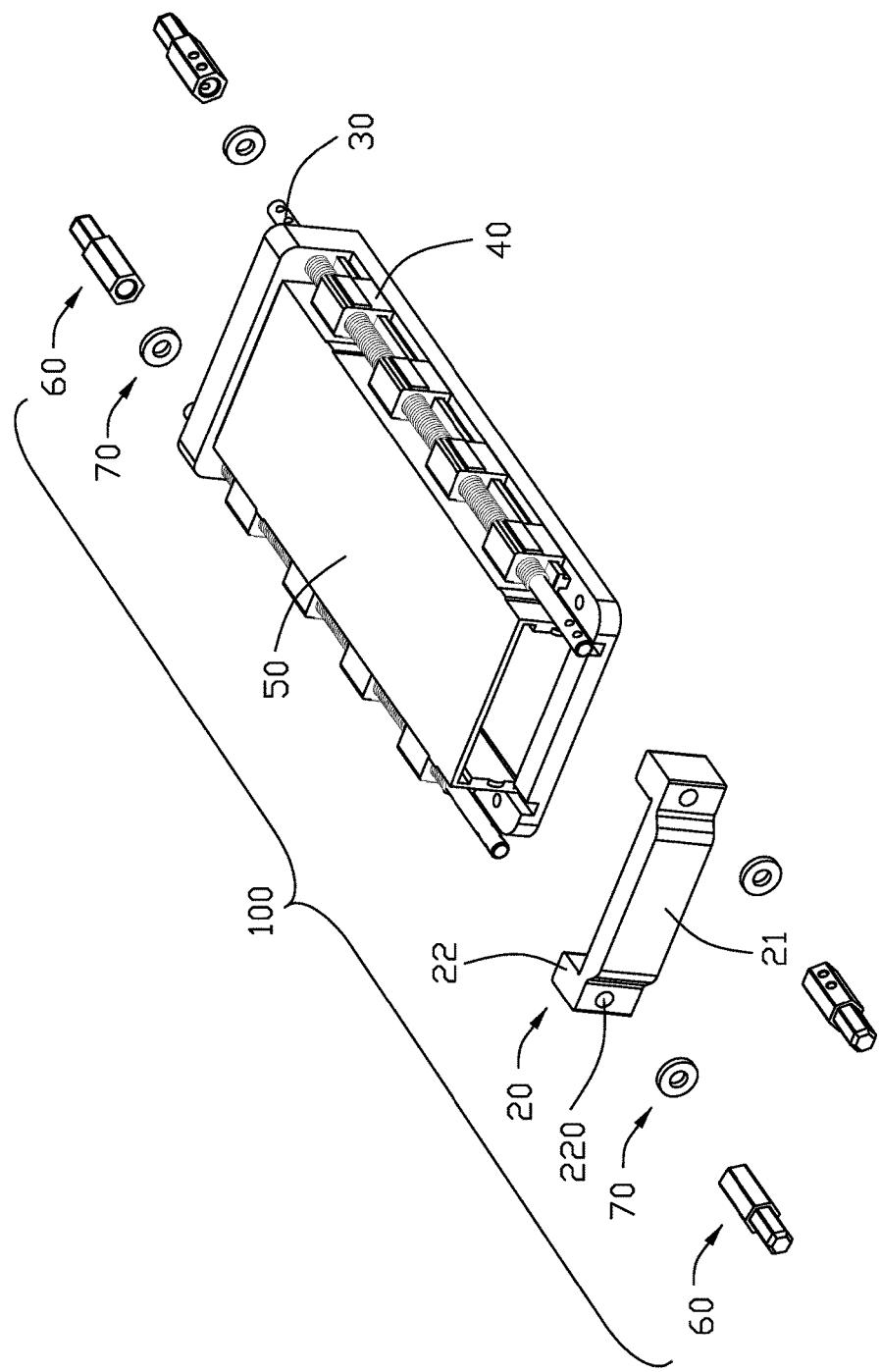
FIG. 4 is another further partly exploded view of the mechanism as shown in FIG. 3.
Figure 5:
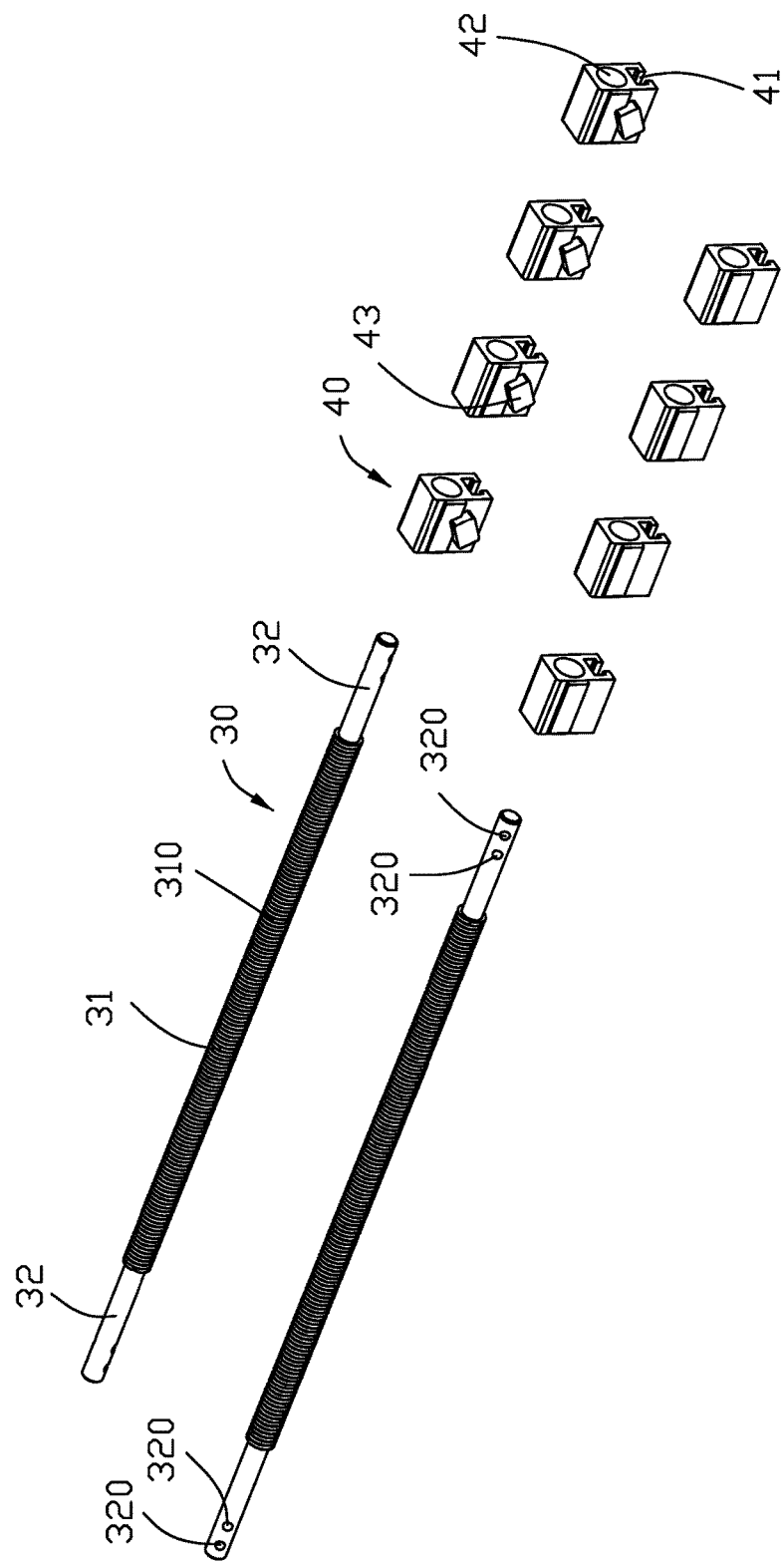
FIG. 5 is a perspective view of lead screws and cam nuts of the mechanism as shown in FIG. 1.
Figure 6:
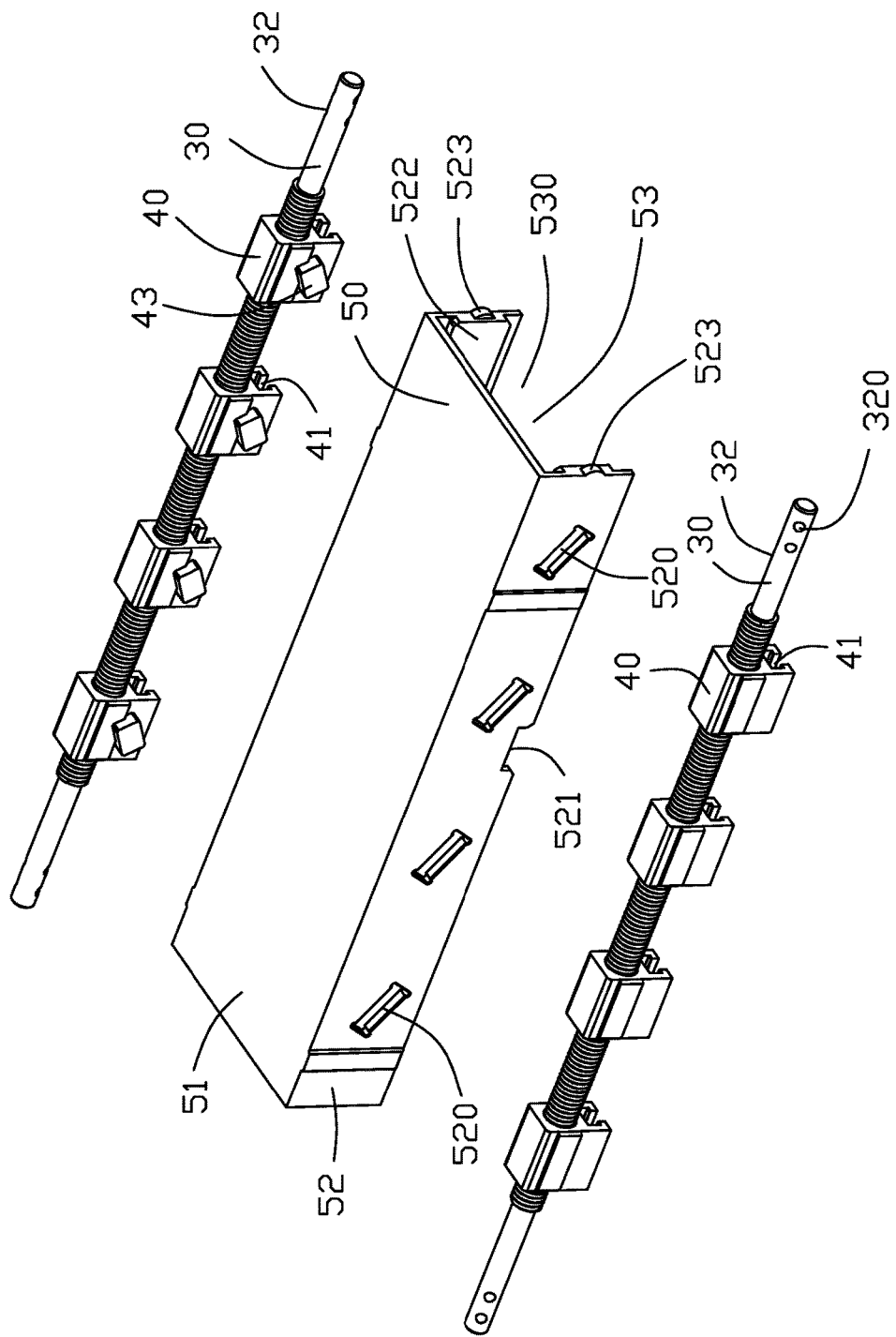
FIG. 6 is a perspective view of the cam nuts mounted on each lead screw and aligned them with follower slots of a rail follower of the mechanism as shown in FIG. 5.
Figure 7:
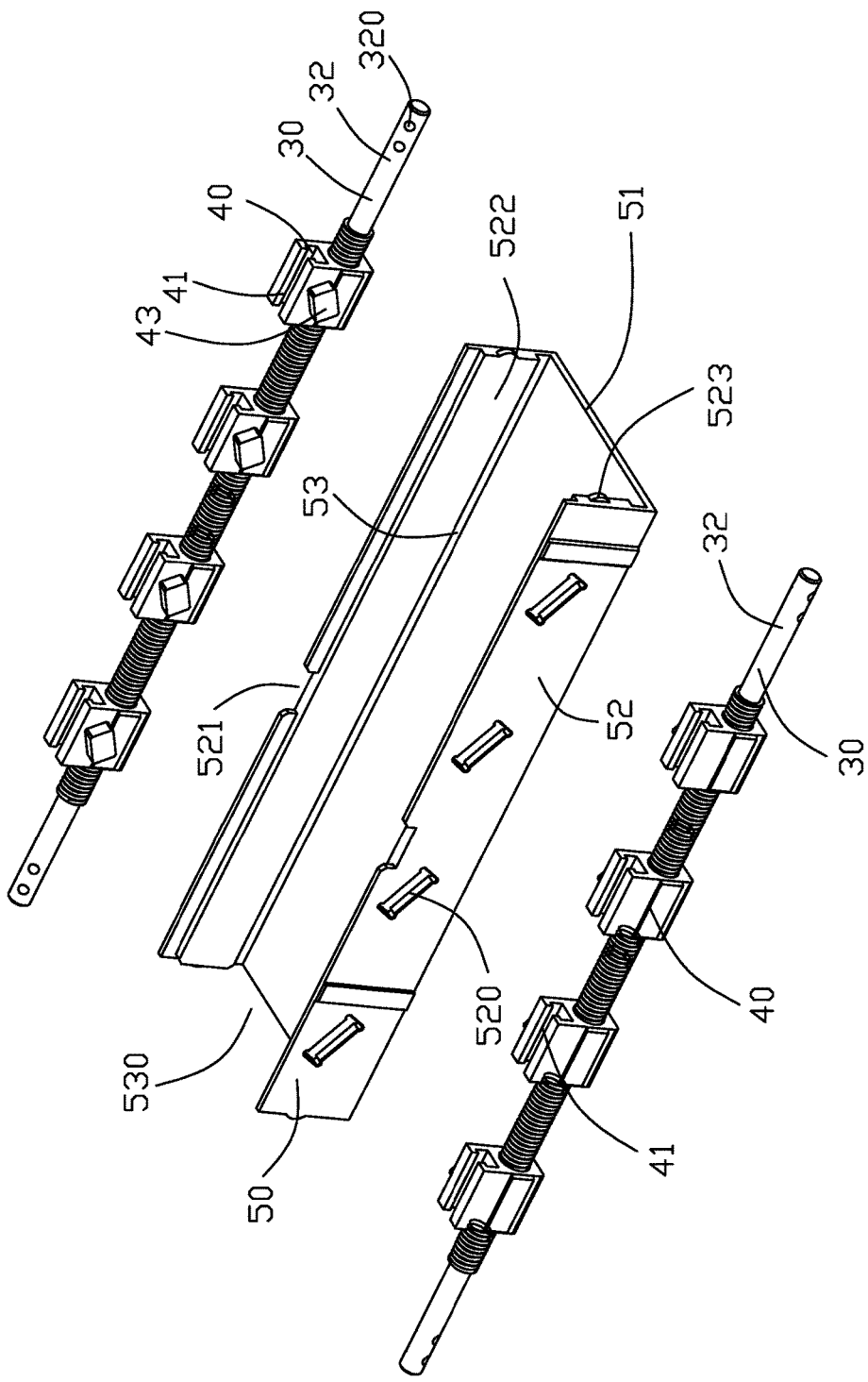
FIG. 7 is another perspective view of the cam nuts mounted on each lead screw and aligned them with follower slots of the rail follower of the mechanism as shown in FIG. 6.
Figure 8:
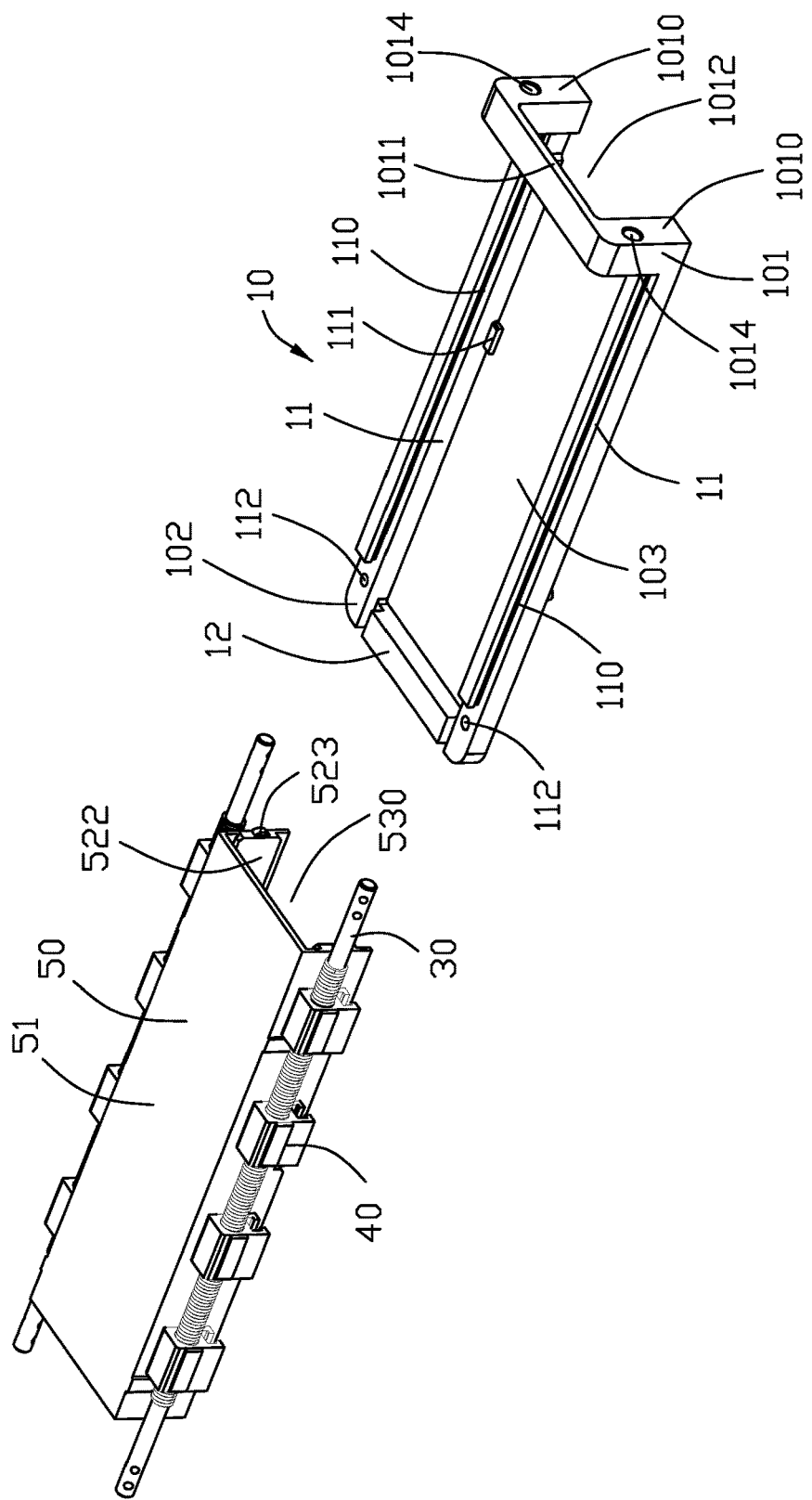
FIG. 8 is a perspective view the cam nuts with the lead screws mounted on the rail follower and aligned them with a base frame of the mechanism as shown in FIG. 7.
Figure 9:
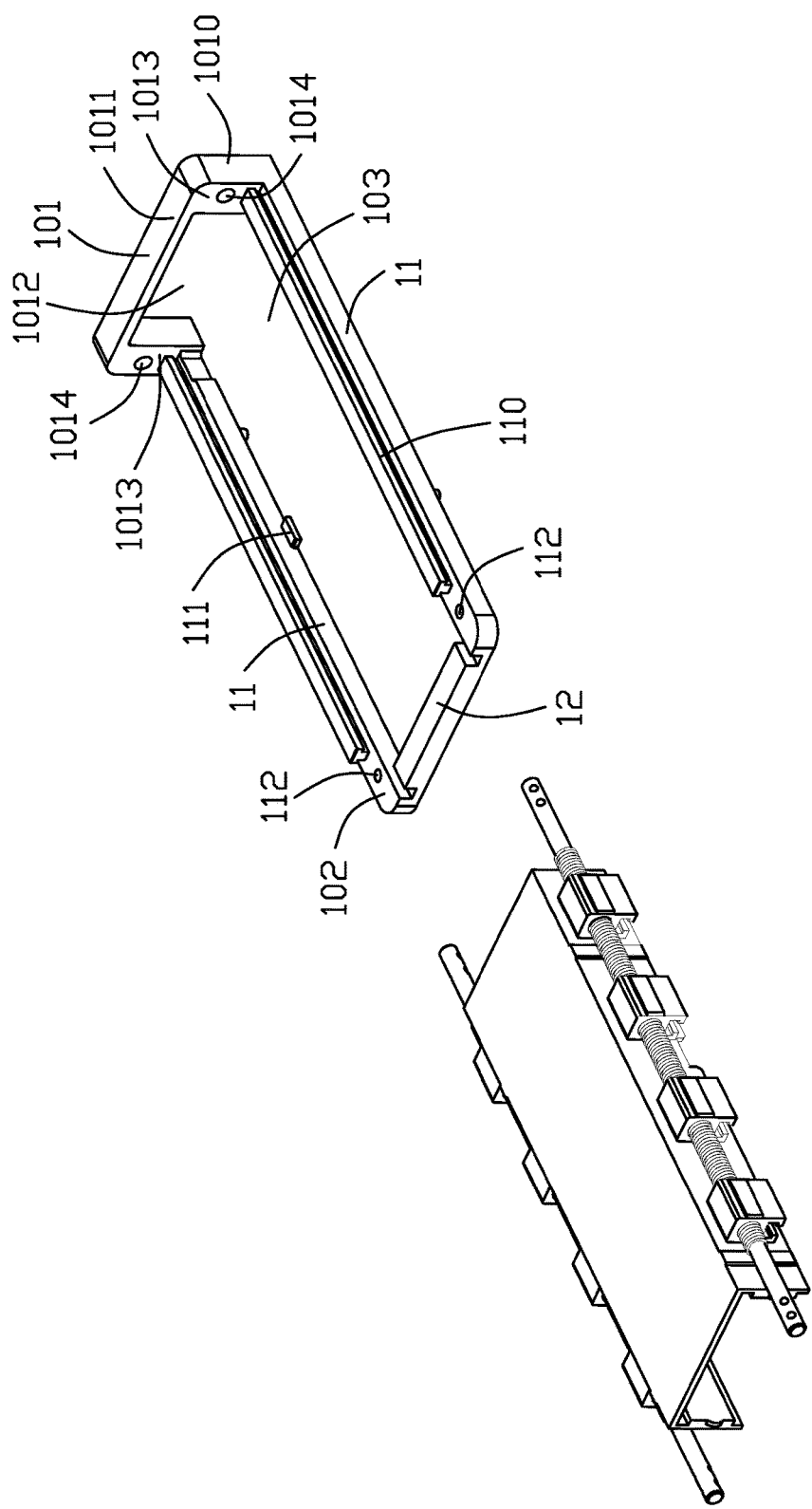
FIG. 9 is another perspective view of the cam nuts with the lead screws mounted on the rail follower and aligned them with the base frame of the mechanism as shown in FIG. 8.
Figure 10:
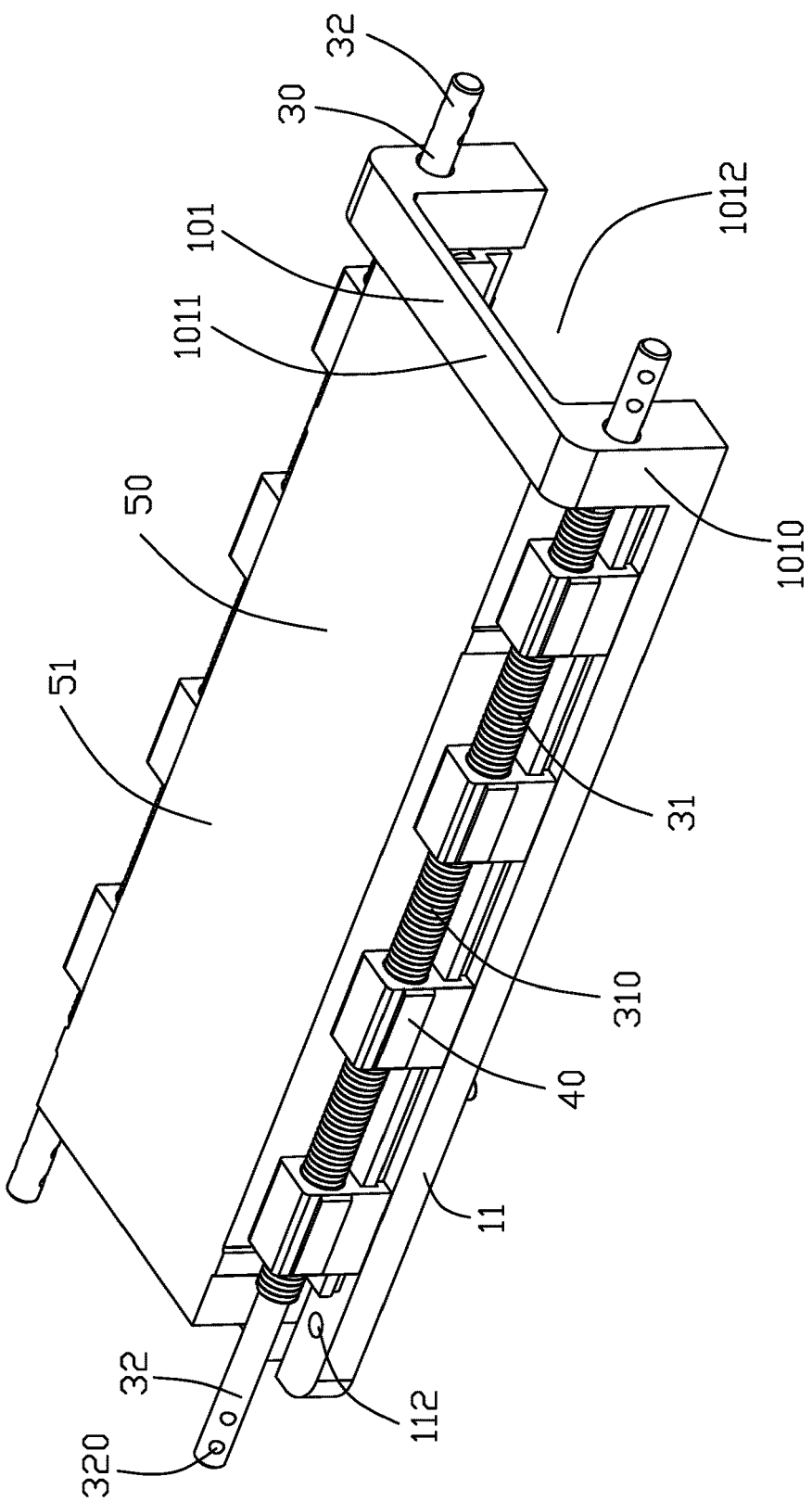
FIG. 10 is a perspective view of the rail follower with the cam nuts and the lead screws mounted on the base frame of the mechanism as shown in FIG. 9.
Figure 11:
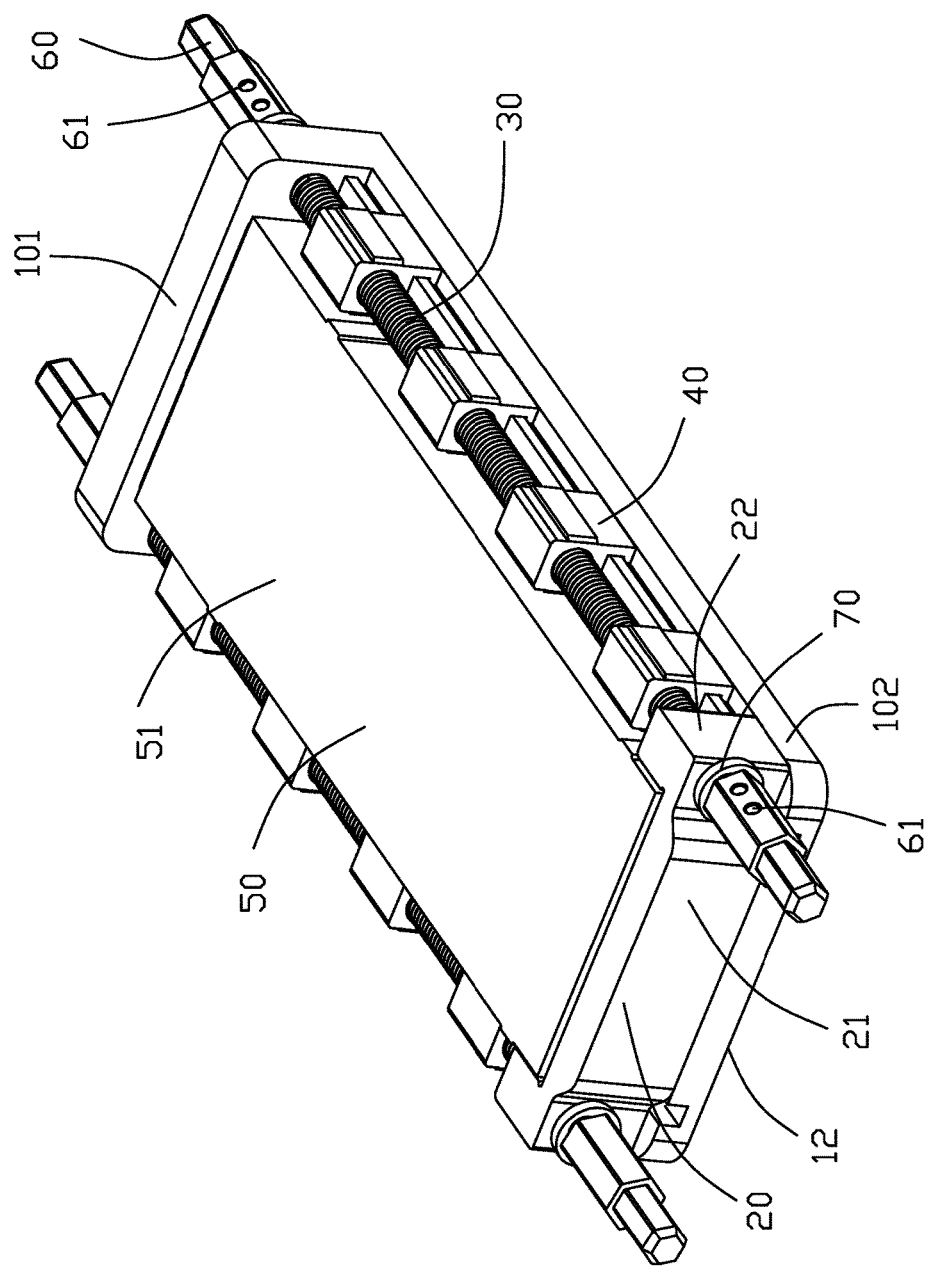
FIG. 11 is another perspective view of the mechanism as shown in FIG. 1.
Figure 12:
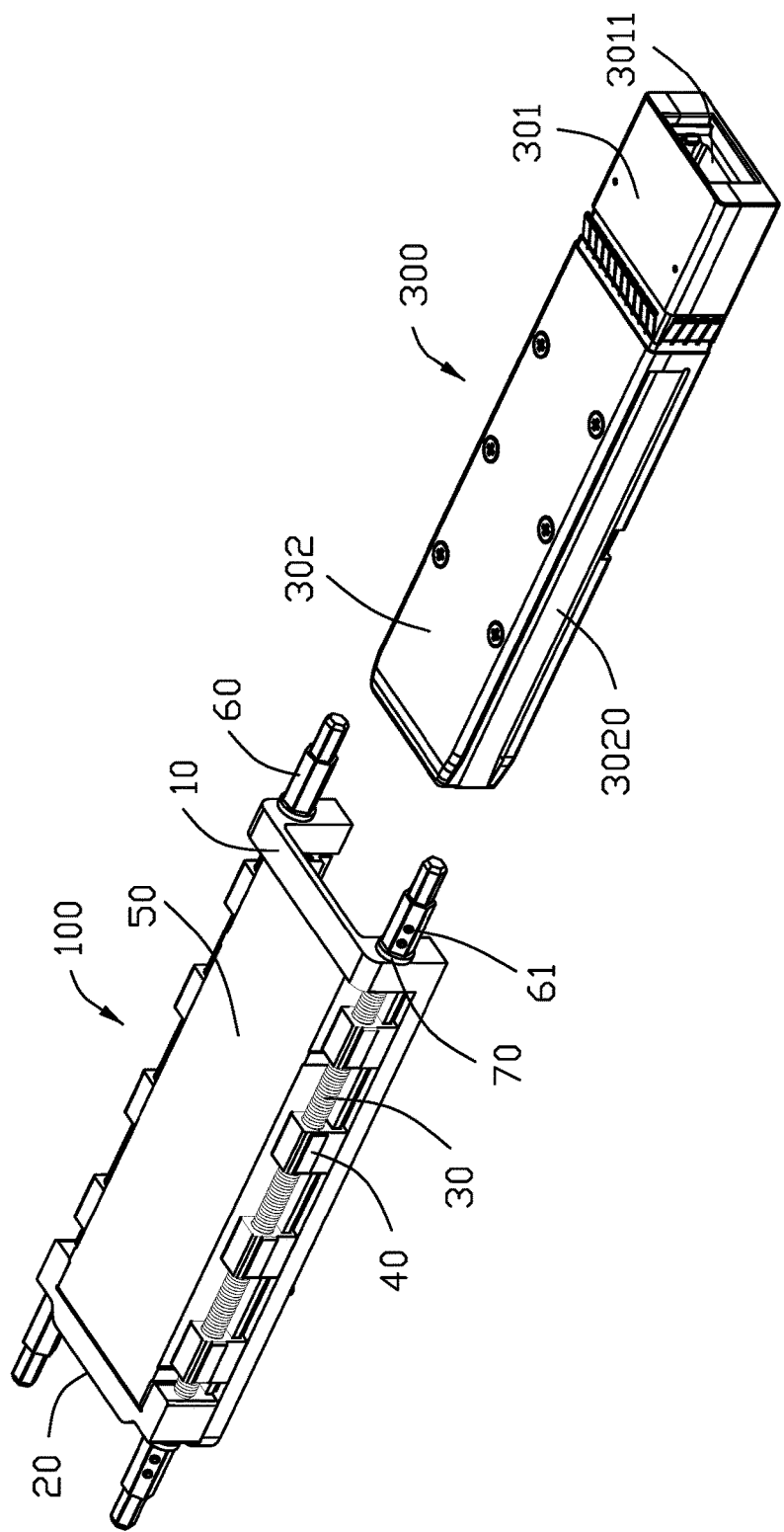
FIG. 12 is perspective view of a mechanism and a transceiver in accordance with present invention.
Figure 13:
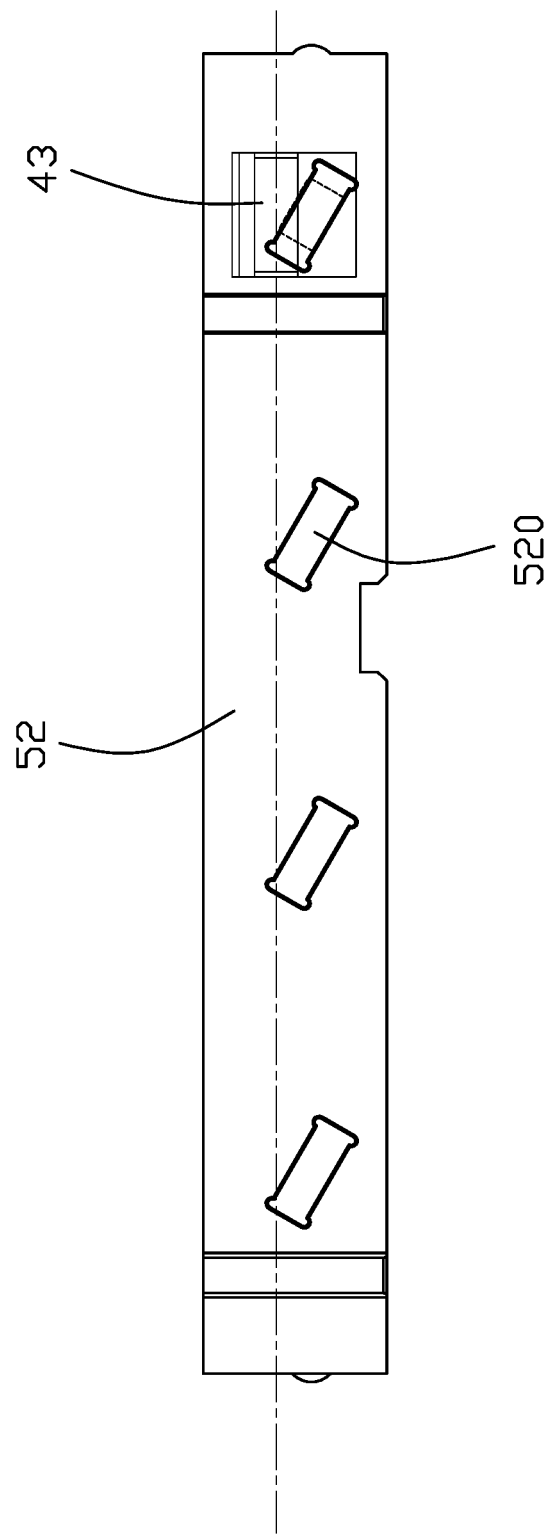
FIG. 13 shows the cam nuts position with the follower slots of the rail follower when the mechanism is in an unmated position in accordance with present invention.
Figure 14:
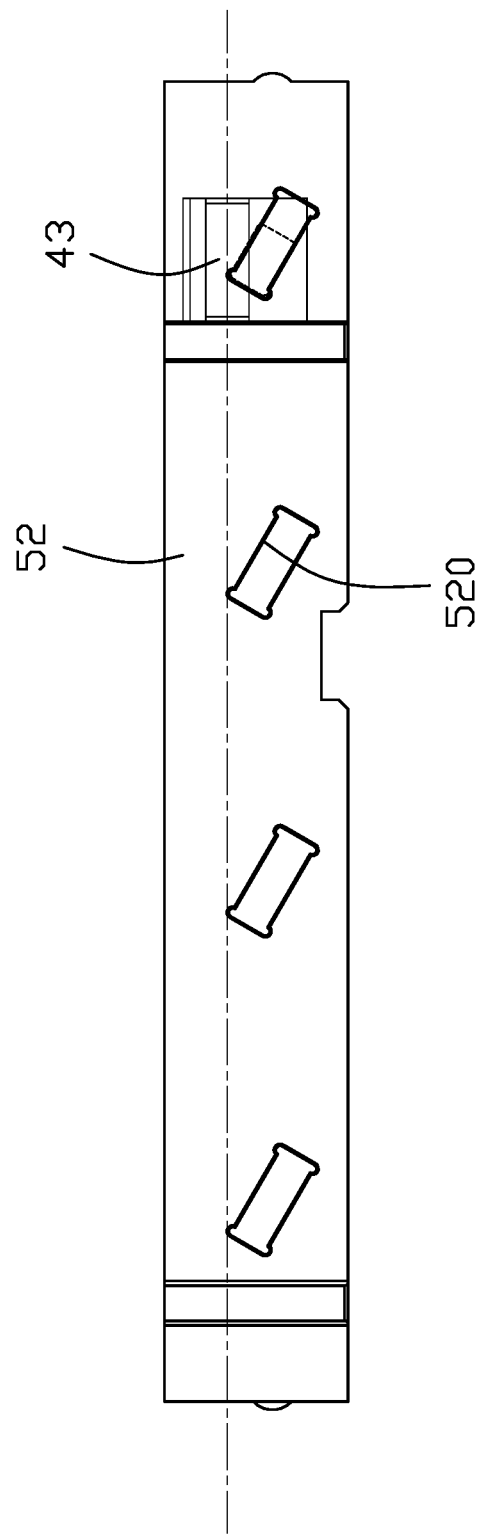
FIG. 14 shows the cam nuts position with the follower slots of the rail follower when the mechanism is in a mated position as shown in FIG. 13.

Reference will now be made in detail to a preferred embodiment of the present invention.

Referring to FIGS. 1 to 18, a mechanism 100 adapted for being mounted on a printed circuit board 200 and receiving a transceiver 300, comprises base frame 10, a back support 20 mounted on a rear portion 102 of the base frame 10, a pair of lead screws 30 mounted on the base frame 10 and the back support 20, four or other suitable number of cam nuts 40 screwed on one of the lead screws 30, another four or other suitable number of cam nuts 40 screwed on the other lead screws 30, a rail follower 50 mounted on the base frame 10, and four driver nuts 60 each with four washers 70 installed on the pair of the lead screws 30, respectively. Rotation of the lead screws 30 actuates the cam nuts 40 moving along a first direction, which pushes the rail follower 50 moving along a second direction perpendicular to the first direction that causes the transceiver 300 to electrically connect with the printed circuit board 200.

Referring to FIGS. 1 to 4, 8 to 12, 15 and 16, the base frame 10 is mounted on the printed circuit board 200 with the screws (not shown). The base frame 10 further comprises a pair of side beams 11 extending rearwardlly from opposite ends of the front portion 101, a rear connection portion 12 connected the side beams 11 at the rear portion 102, and a middle space 103 formed by the front portion 101, the side beams 11 and the rear connection portion 12. Both of the side beams 11 comprise a guide rail 110, and a positive locking tab 111 extending into the middle space 103. Both of the side beams 11 further define a through hole 112 extending vertically at the rear portion 102. The front portion 101 comprises vertical portions 1010 extending from the side beams 11 respectively, a front connection portion 1011 connected the vertical portions 1010, and a mating hole 1012 formed by the vertical portions 1010 and the front connection portion 1011. The front portion 101 comprises a pair of bearing surfaces 1013 disposed at a rear side of the vertical portions 1010, respectively. The mating hole 1012 is in communication with the middle space 103. Both of the vertical portions 1010 define a front mating hole 1014 horizontally extending therethrough.

Referring to FIGS. 1 to 4, 11 and 12, the back support 20 comprises a base portion 21 extending transversely, and a pair of mating beams 22 extending forwardly from two opposite sides of the base portion 21. Both of the mating beams 22 define a rear mating hole 220 horizontally extending therethrough. The back support 20 is installed at a rear portion 102 of the base frame 10 and secured in place with screws (not shown).

Referring to FIGS. 1 to 12, each of the lead screws 30 comprises a body portion 31 and two ends 32. Each of the body portions 31 comprises threads 310. Each of the ends 32 defines two dowel pin holes 320 radially extending therethrough. One end 32 of each of the lead screws 30 is inserted into the front mating hole 1014 and forwardly extending beyond the front portion 101 of the base frame 10, with the two dowel pin holes 320 disposed at front of the front portion 101 of the base frame 10. The other end 32 of the each of the lead screws 30 is inserted into corresponding rear mating hole 220 and rearwardly extending beyond the back support 20, with the two dowel pin holes 320 disposed at rear of the back support 20. The driver nuts 60 and the washers 70 are installed on ends 32 of the lead screws 30. Each of the driver nuts 60 defines dowel pin holes 61 in communication with the dowel pin holes 320 of the lead screws 30 respectively, after the driver nuts 60 installed on the lead screws 30. The driver nuts 60 are further secured with lead screws 30 by dowel pins installed on the dowel pin holes 61, 320 of the driver nuts 60 and the lead screws 30, respectively. The lead screws 30 are self locking type.

Referring to FIGS. 1 to 14, each of the cam nuts 40 defines a guide slot 41 at a bottom and guided by the guide rail 110, and a mounting hole 42 extending therethrough. The cam nuts 40 are slid on to the guide rails 110, respectively. The mounting hole 42 comprise internal threads threaded with the threads 310 of the lead screw 30. Each of the cam nuts 40 comprises a sliding cam 43 at a side surface and inclined extending.

Referring to FIGS. 1 to 4, and 8-14, the rail follower 50 is disposed between the front portion 101 of the base frame 10 and the back support 20, and disposed between the pair of lead screws 30. The rail follower 50 comprises a top wall 51, a pair of side walls 52 extending from opposite side of the top wall 51 respectively, and a receiving room 53 being formed by the top wall 51 and the side walls 52. The top wall 51 is used as a large heat sinking surface. Both of the side walls 52 define four follower slots or actuating devices 520 mated with the sliding cams 43 of the cam nuts 40 respectively. The cam nut 40 pitch on the lead screw 30 matches the pitch of the follower slots 520 on the rail follower 52. Both of the side walls 52 define a positive locking slot 521 at bottom side engaged with the locking tab 111. The follower slots 520 extend along an oblique direction inclined with a front to rear direction and a vertical direction. Both of the side walls 52 comprise a guide 522 in internal side for guiding and fixing the transceiver in the receiving room 53 of the rail follower 50. Both of the side walls 52 comprise a bearing surface 523 at front end for bearing with the bearing surface 1013 of the front portion 101, and at a rear end for bearing with the mating beams 22. The receiving room 53 comprises a front hole 530 in communication with the mating hole 1012 for receiving the transceiver 300 along the front to rear direction. The receiving room 53 is cooperated with the middle space 103 to receive the transceiver 300.

Referring to FIGS. 12 to 18, the transceiver 300 may be an optical transceiver, or an active optical cable, or an electrical cable assembly. In this embodiment, the transceiver 300 is an optical transceiver comprising a head portion 301 having an opening 3011 for receiving an optical connector (not shown), and a body portion 302 connected with the head portion 301 for being inserted into the receiving room 53 of the rail follower 50. The body portion 302 defines a pair of guiding slots 3020 at two opposite sides, respectively. The transceiver 300 is assembled together with the rail follower 50 by the guiding slots 3020 engaged with guides 522. The transceiver 300 has four Land Grid Array (LGA) connectors 303 at the belly with 400 total connections (with 100 connections each). The LGA connectors 303 on one side with resilient/deflectable contacts (not shown) thereof are connected to the printed circuit board 200 which has LGA landing pads (not shown). On the other side the LGA connectors 303 connect to an inner printed circuit board which is received in the transceiver 300 and also having LGA landing pads (not shown). In this embodiment, the mechanism 100 is designed for four LGA connector sockets. However the mechanism 100 can be extended or modified to accommodate higher/small number of LGA connector sockets. In other words the mechanism 100 is scalable. Currently the mechanism 100 is designed for LGA connector sockets, but can be modified for usage with BGA (Ball Grid Array) connectors. Currently, for a transceiver 300 width of 23.5 mm, a height of 9.8 mm and length of 101 mm, the mechanism 100 width is 34 mm, height is 12.5 mm and length is 87 mm, using a volume of 36975 mm3 for 400 LGA connections. Mechanism width and length can be further optimized based on the specific application requirements and stress analysis. Considering 40 g of force required to fully compress each LGA connector 303, any mechanism 100 would need to generate 16 kg of force to fully compress 400 LGA connectors 303. Using this type of mechanism 100 arrangement, required force (16 kg) is generated with sufficient mechanical advantage so as to allow ease in installation with human hand. EMI compliance for the mechanism 100 and the transceiver 300 can be achieved by having EMI fingers 304 either on the base frame 10 or on the transceiver 300. Other designs of EMI shields are also possible.

Figure 15:
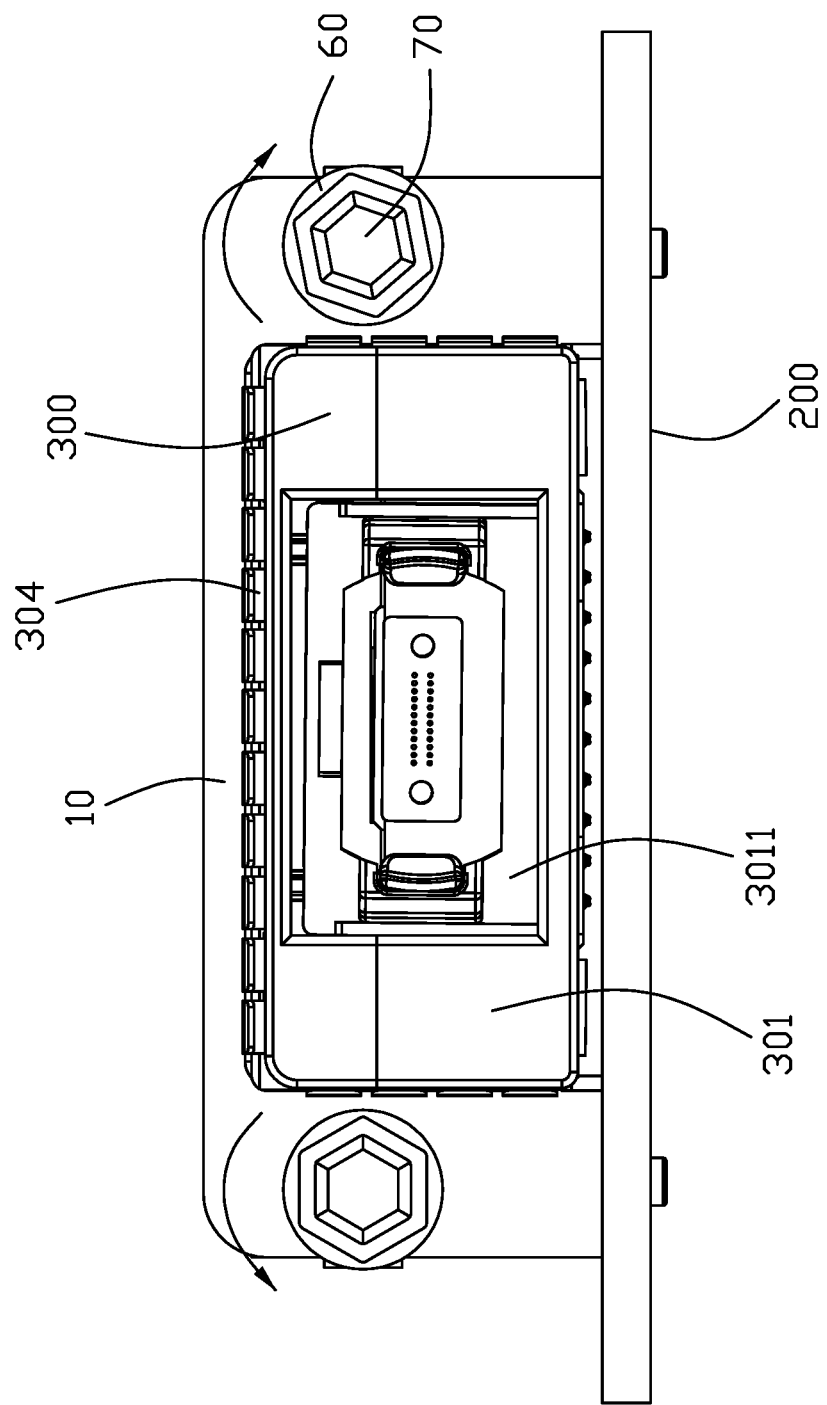
FIG. 15 is front side view of the transceiver plugged in the mechanism when the mechanism with the transceiver is in an unmated position in accordance with present invention.
Figure 16:
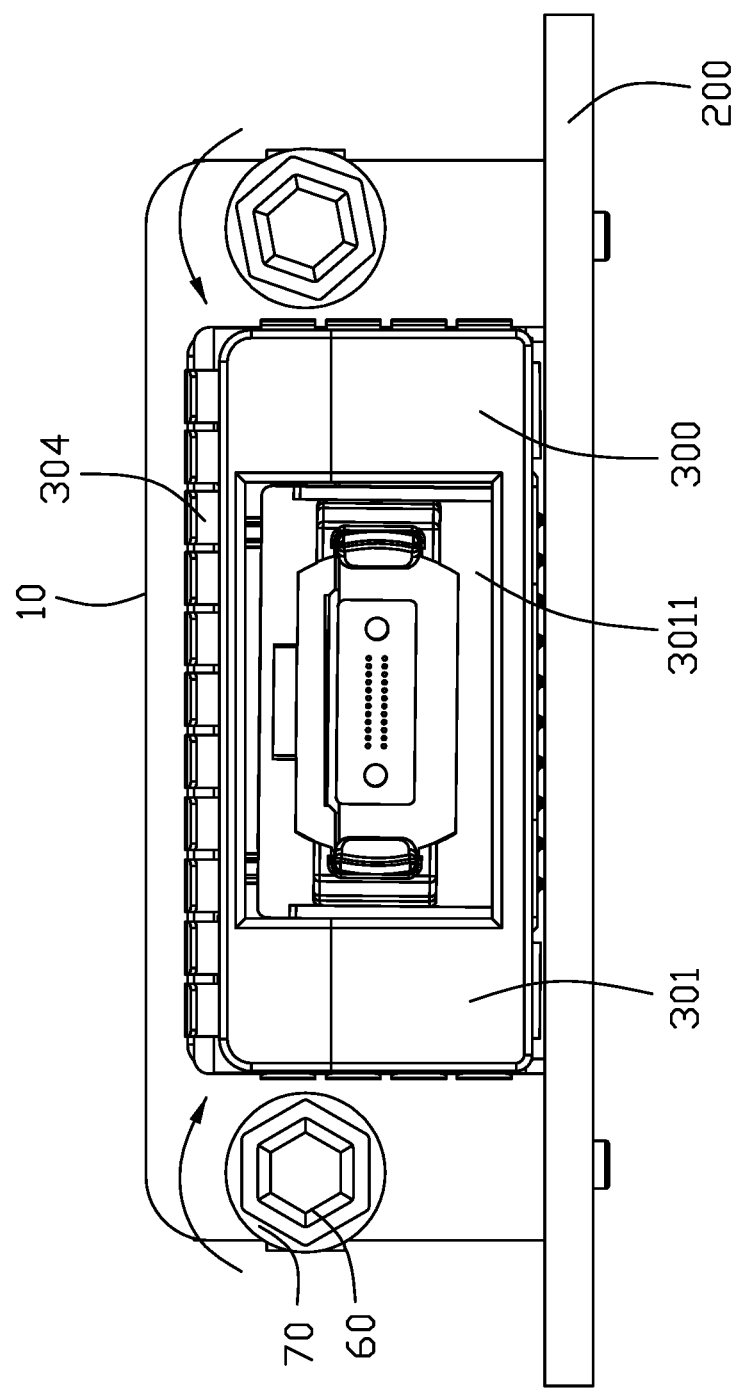
FIG. 16 is front side view of the transceiver plugged in the mechanism when the mechanism with the transceiver is in a mated position as shown in FIG. 15.
Figure 17:
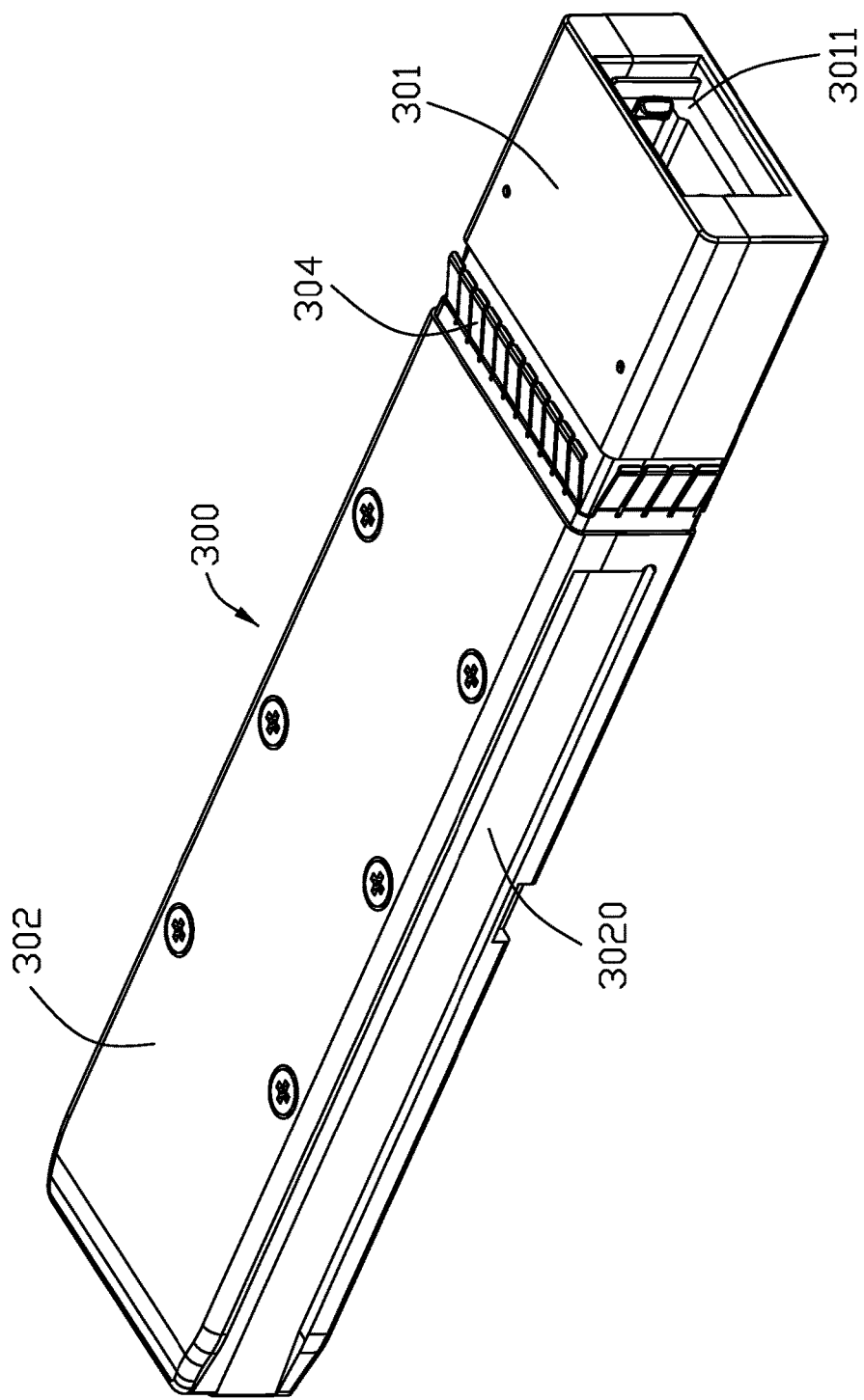
FIG. 17 is perspective view of the transceiver as shown in FIG. 12.
Figure 18:
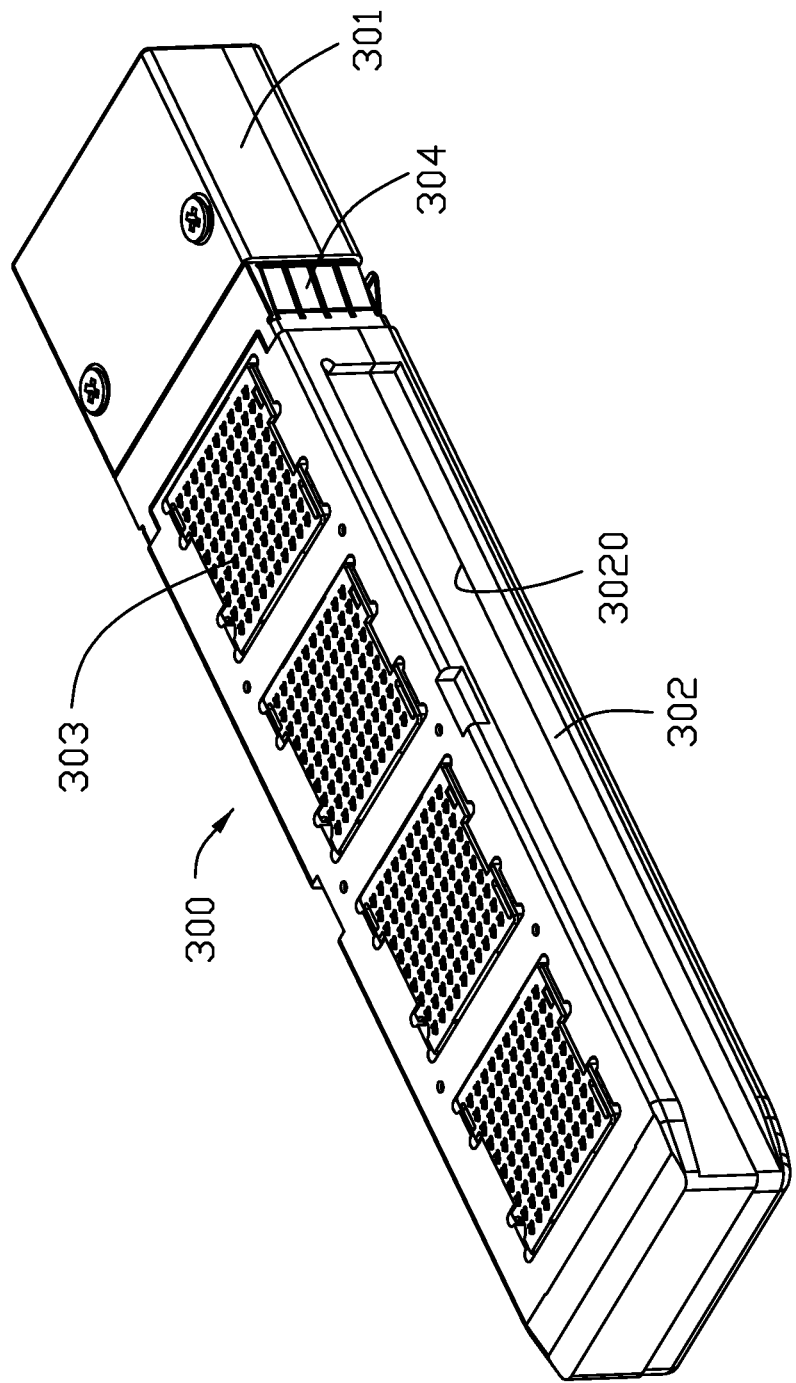
FIG. 18 is perspective view of the transceiver as shown in FIG. 17.
Figure 19:
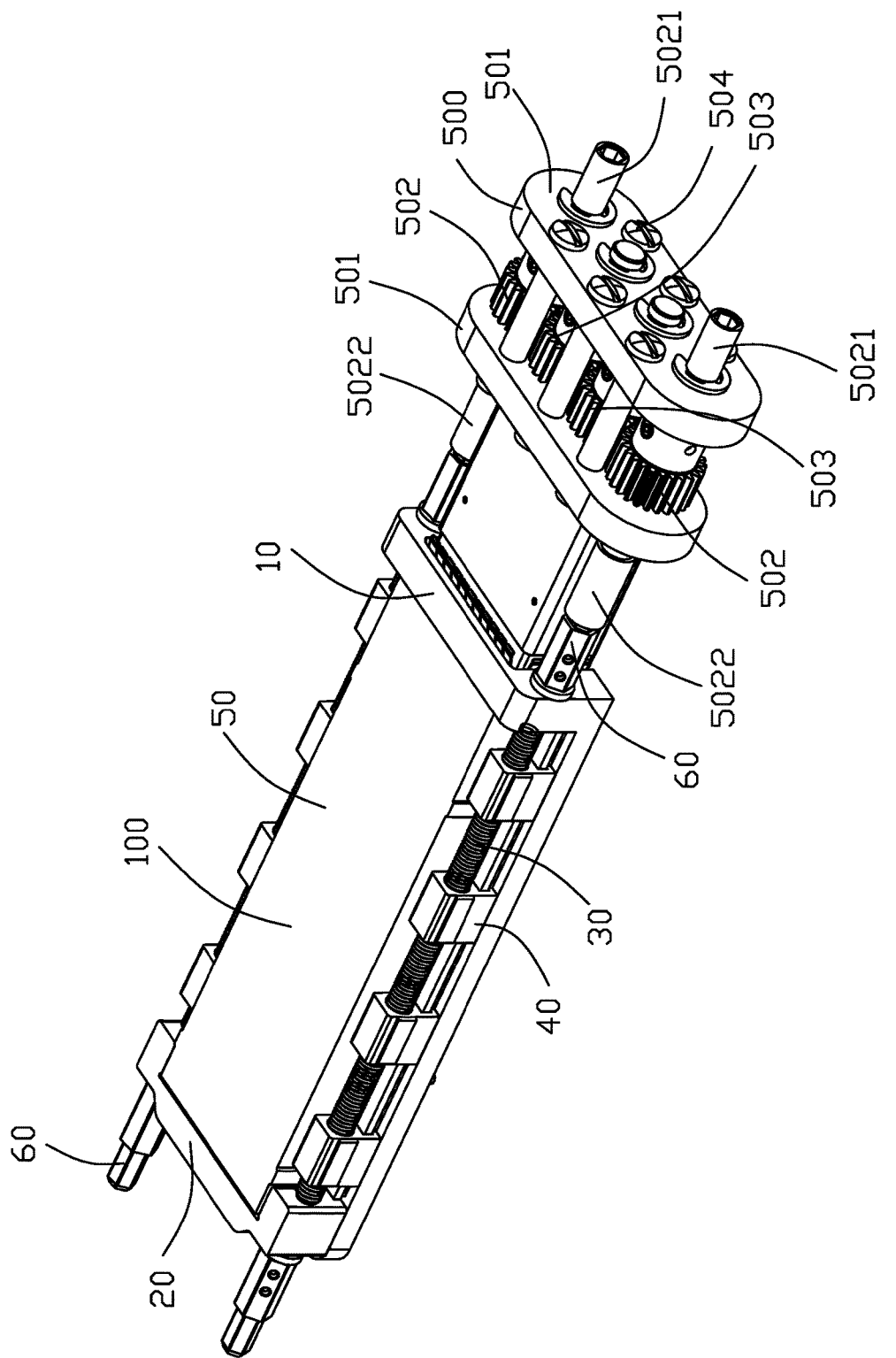
FIG. 19 is perspective view of a tool mated with the mechanism and the transceiver as shown in FIG. 15.
Figure 20:
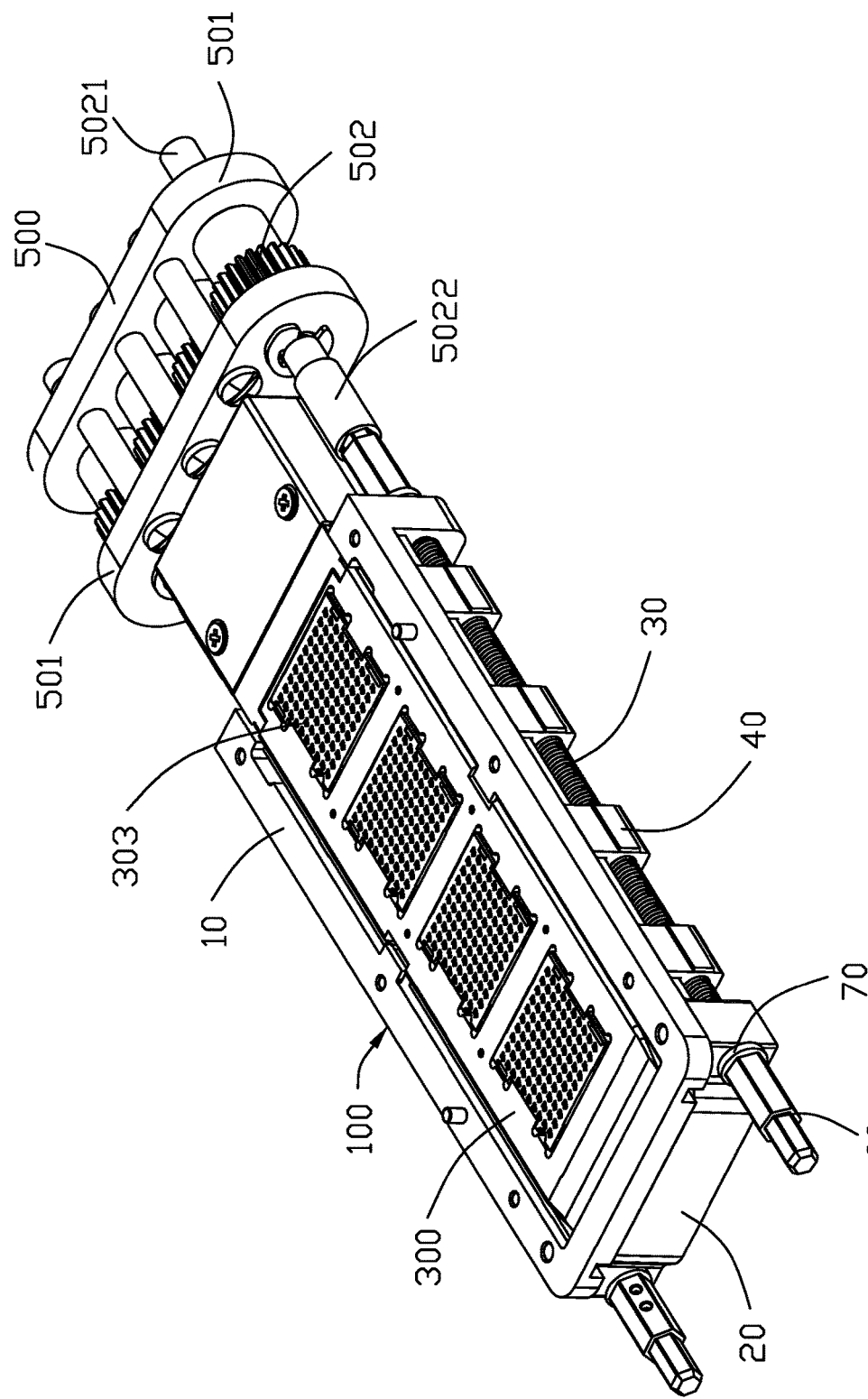
FIG. 20 is another perspective view of the tool mated with the mechanism as shown in FIG. 19.
Figure 21:
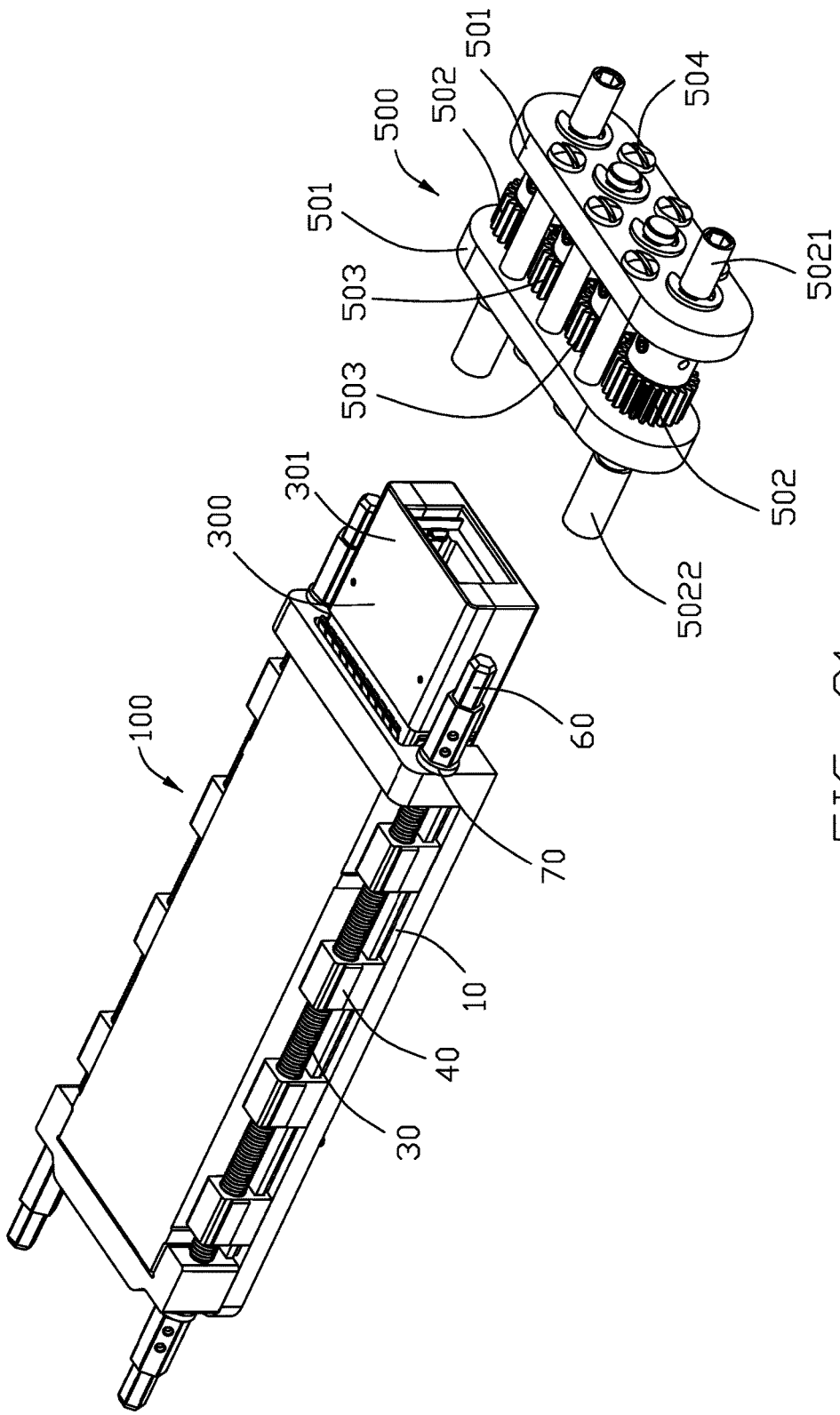
FIG. 21 is a perspective view of a tool unmated with the mechanism and the transceiver as shown in FIG. 15.
Figure 22:
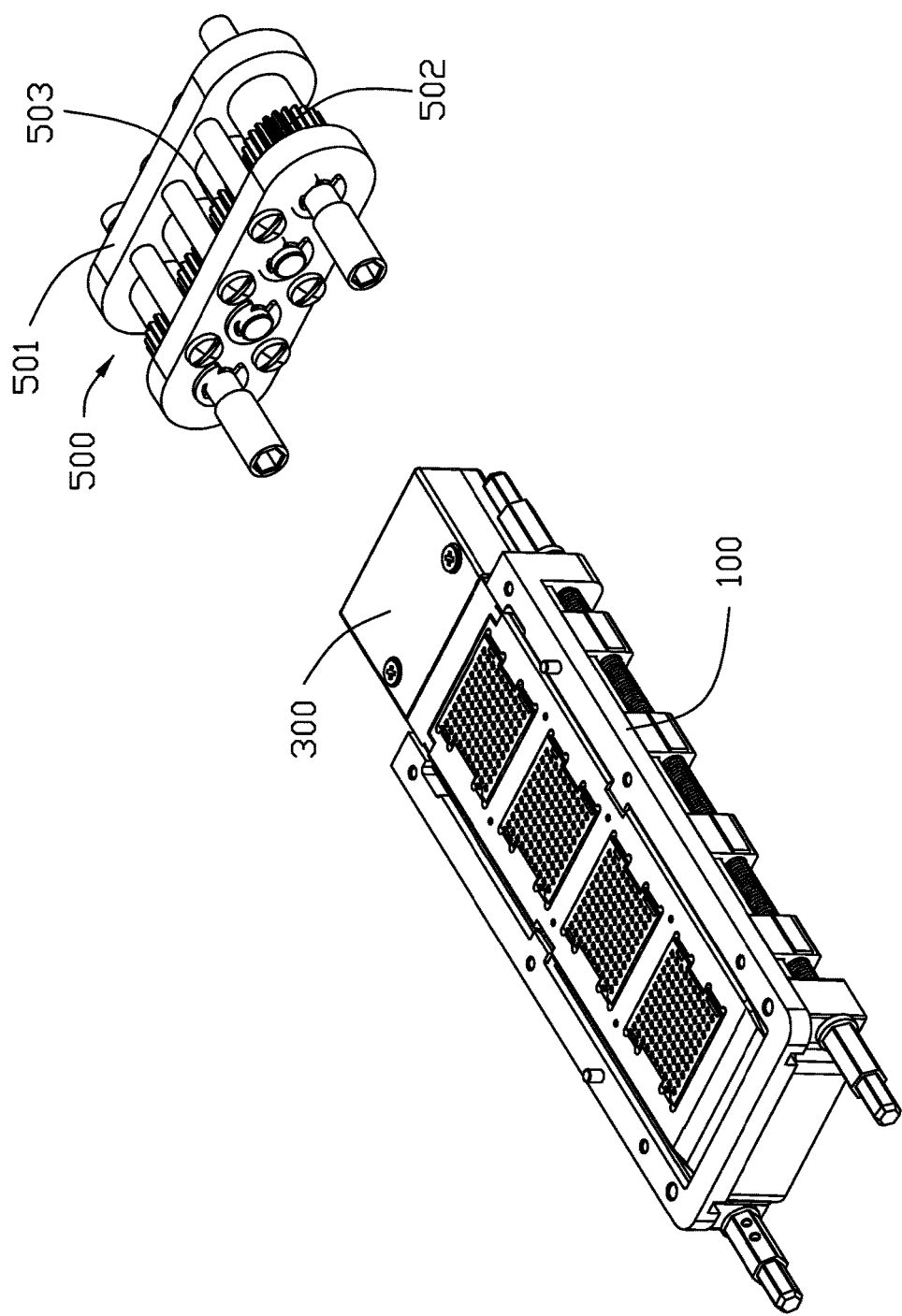
FIG. 22 is another perspective view of the tool unmated with the mechanism as shown in FIG. 21.
Figure 23:
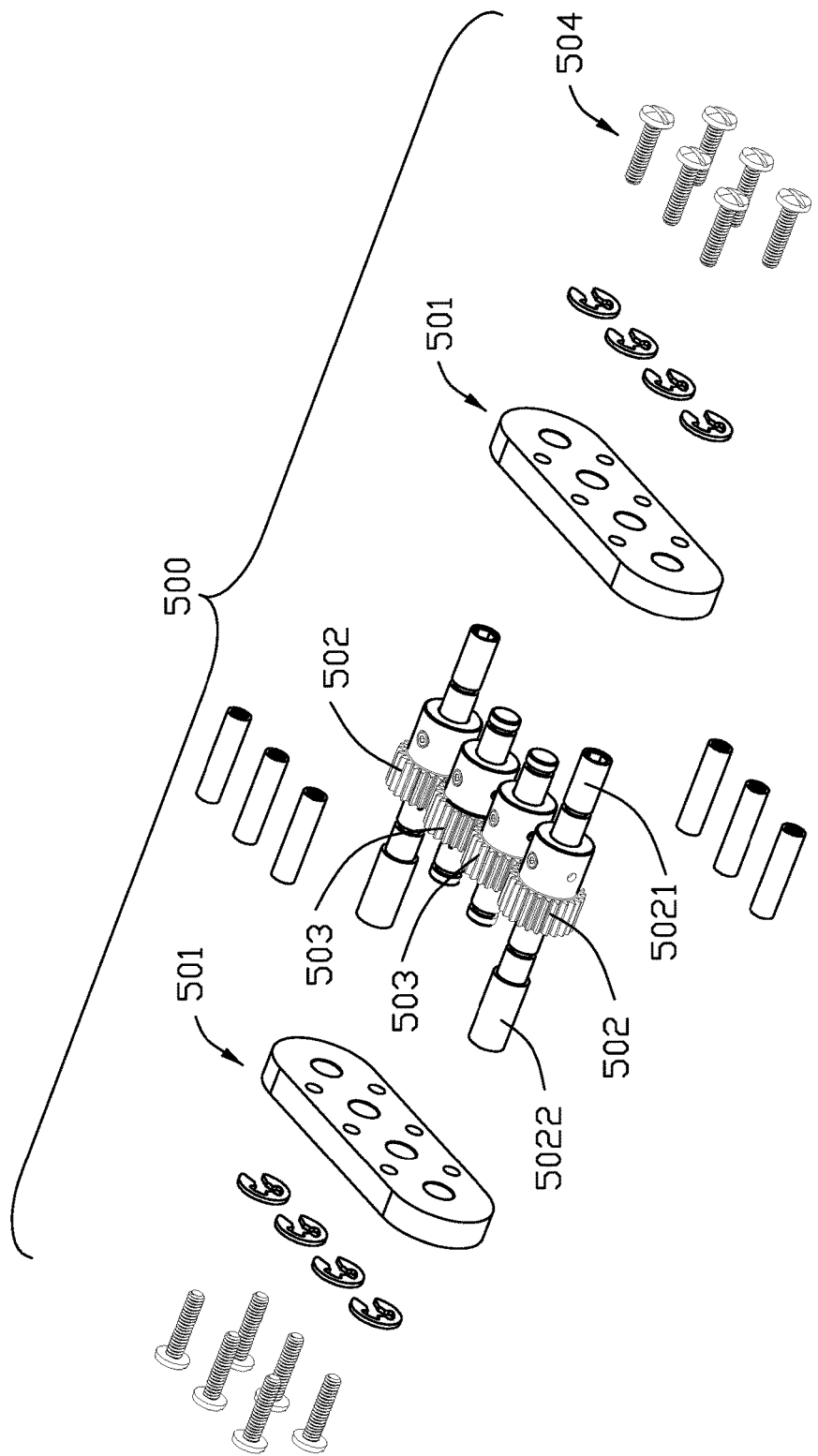
FIG. 23 is an exploded view of the tool as shown in FIG. 21.
Figure 24:
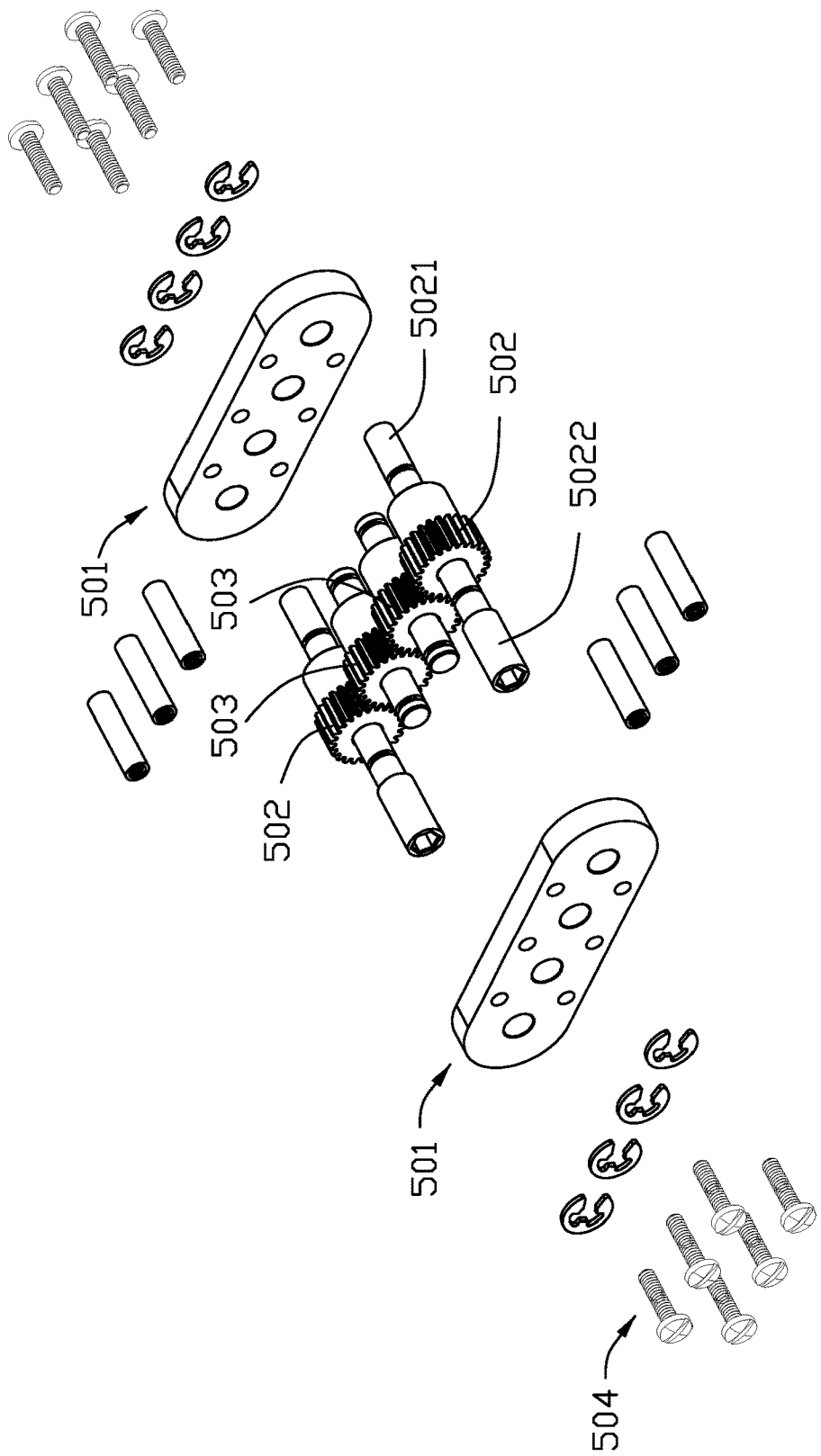
FIG. 24 is another exploded view of the tool as shown in FIG. 23.

The mechanism 100 works in the following manner. With the mechanism 100 fully assembled on the printed circuit board 200, the transceiver 300 is inserted horizontally into the receiving room 53 through the front hole 530 and the mating hole 1012. During insertion, the transceiver 300 glides along the guiding slots 3020 of the rail follower 30. The transceiver 300 is guided by the guiding slots 3020 engaged with guides 522, when the transceiver 300 is plugged. Transceiver 300 is inserted horizontally till it backs up at the rear end of the mechanism 100. The front driver nuts 60 for the lead screw 30 are rotated as shown in FIG. 16. Rotation of the lead screws 30 actuates the cam nuts 40, the sliding cams 43 moving along the first direction in the follower slots 520 to actuate the rail follower 50 moving along the second direction, which push the transceiver 300 vertically downwards. This motion causes vertical plug-in of the transceiver 300. To unplug the transceiver 300 from the mechanism, the front driver nuts 60 of the lead screw 30 are rotated as shown in FIG. 15 and transceiver 300 is then horizontally pulled out of the mechanism 100. There are two features in the mechanism 100 that ensure positive plug-in of the transceiver 300. One of the features is that the positive locking slot 521 of the rail follower 50 engages with positive locking tab 111 of the base frame 10. The other feature is that the lead screws 30 are self locking type.

Referring to FIGS. 12 to 24, in the mechanism 100, one lead screw 30 actuates four cam nuts 40 simultaneously. For the transceiver 300 to move vertically downwards, both the lead screws 30 need to be actuated simultaneously. A tool 500 comprising of a gear train 510 has been designed to achieve simultaneous movement of two lead screws 30. The tool 500 is mated with the driver nuts 60 to drive the two lead screws 30 simultaneous movement. The tool 500 comprises a pair of plats 501, a pair of driver or driven gears 502 disposed between the plats 501, a pair of middle gears 503 disposed between the plats 501 and between the driver or driven gears 502, a plurality of screws 504 connected the two plates 501. The pair of middle gears 503 are geared with each other, and with one of middle gear 503 geared with one of the driver or driven gear 502 and the other middle gear 503 geared with the other driver or driven gear 502. Both of the driver or driven gears 502 comprises a driver end 5021 extending beyond one of the plates 501 for user to operate, and an opposite end 5022 extending beyond the other one of the plate 501 to mate with the driver nuts 60. Other versions of the same mechanism 100 are also possible. For example, the driver nuts 60 could be inside the base frame 10 instead of being exposed outside, design of the drive nuts 60, cam nuts 40 can be different. Further, the lead screw 30 is used in the mechanism 100 but any other screw with regular threads can also be used.

Referring to FIGS. 5 to 11, the mechanism 100 is assembled in the following manner: the base frame 10 is mounted on the printed circuit board 200 with the screws. Four Cain nuts 40 are screwed on to each lead screw 30. The cam nut pitches on the lead screws 30 are adjust to match the pitches of the follower slots 520 on the rail follower 50. The cam nuts 40 with the lead screws 30 are mounted on each side of the rail follower 50. The assembly including the cam nuts 40, the lead screws 30 and the rail follower 50 is then slid on to the guide rail 110 of the base frame 10 along rear to front direction. The back support 20 is then installed at a rear end of the assembly and secured in place with screws. Subsequently, the driver nuts 60 and washers 70 are installed on the assembly and secured with dowel pins. The above steps are for the mechanism 100 to work properly. With changes to the design, the above steps could change.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mechanism mounted on a printed circuit board for insertion of a transceiver, comprising:
   a frame structure;
   a pair of lead screws mounted on and turnable with respect to the frame structure;
   a pair of cam units each coupled to a corresponding lead screw, the cam unit being actuatable by a turning movement of the lead screw; and
   a rail follower disposed between the pair of cam units and confined to the frame structure, the rail follower having a receiving room for inserting the transceiver along a first direction, the rail follower being movable by the cam units actuated by the lead screws to move along a second direction perpendicular to the first direction.

2. The mechanism as recited in claim 1, wherein the frame structure comprises a base frame and a back support mounted on a rear portion of the base frame, the lead screws mounted on and turnable with respect to the base frame and the back support, and two opposite ends of each lead screw extend beyond the base frame and the back support.

3. The mechanism as recited in claim 2, wherein the base frame comprises a front portion having a mating hole, and a pair of side beams extending rearwardlly from opposite ends of the front portion, each of the side beams comprising a guide rail.

4. The mechanism as recited in claim 3, wherein each of the cam units comprises a plurality of cam nuts screwed on to the corresponding lead screw, each of the cam nuts having a guide slot guided by the guide rails and a sliding cam.

5. The mechanism as recited in claim 4, wherein the rail follower is disposed between the front portion of the base frame and the back support, the receiving room defining a front hole in communication with the mating hole for receiving the transceiver, the rail follower defining a plurality of follower slots mated with the sliding cams of the cam nuts respectively.

6. The mechanism as recited in claim 5, wherein the rail follower comprises a top wall, and a pair of side walls extending from opposite side of the top wall respectively, the receiving room being formed by the top wall and the side walls.

7. The mechanism as recited in claim 6, wherein the slots are disposed on the side walls, the cam nut pitches on both of the lead screws matched the pitches of the follower slots on the side walls of the rail follower.

8. The mechanism as recited in claim 6, wherein each of the side beams of the base frame comprises a positive locking tab, and both of the side walls of the rail follower defines a positive locking slot engaged with the locking tab.

9. The mechanism as recited in claim 6, wherein each of the side walls comprises a guide in internal side for guiding and fixing the transceiver in the receiving room of the rail follower.

10. The mechanism as recited in claim 6, wherein each of the side walls comprises a bearing surface at a front end for bearing with the front portion of the base frame.

11. The mechanism as recited in claim 5, wherein the follower slots extend along a direction inclined with the first direction, the sliding cams moving along the first direction in the follower slots to actuate the rail follower moving along the second direction.

12. The mechanism as recited in claim 4, further comprising at least a pair of driver nuts each together with a respective washer installed on a corresponding one of the pair of the lead screws.

13. The mechanism as recited in claim 12, wherein each of the lead screws has at least one dowel pin hole at an end thereof, and each of the driver nuts has a corresponding dowel pin hole, the driver nuts secured with the lead screws by dowel pins, respectively.

14. A method for connecting a transceiver to a printed circuit board (PCB), comprising the steps of:
   providing a mechanism comprising a frame structure and a rail follower actuatable to move relative to the frame structure toward the PCB, the rail follower having a receiving room;
   mounting the mechanism on the PCB;
   providing a transceiver comprising an electrical connector at a surface thereof proximal to the PCB;
   plugging the transceiver into the receiving room along a direction parallel to the PCB; and
   driving the mechanism to make the rail follower together with the transceiver move toward the PCB to electrically connect the connector with the PCB.

15. The method as recited in claim 14, further comprising a step of providing a tool, the mechanism comprising two driver nuts, the tool comprising a gear train mated with the driver nuts to drive a simultaneous movement of the two driver nuts.

16. A transceiver system comprising:
   a mechanism mounted on a printed circuit board (PCB), the mechanism comprising a frame structure and a rail follower actuatable to move relative to the frame structure toward the PCB, the rail follower having a receiving room; and
   a transceiver receivable along a front-to-back direction parallel to the PCB in the receiving room to be movable together with the rail follower, the transceiver comprising an electrical connector at a surface thereof proximal to the PCB.

17. The transceiver system as recited in claim 16, wherein the rail follower defines a pair of guides in an internal side thereof, and the transceiver defines a pair of guiding slots at two opposite sides thereof to engage with the guides.

18. The transceiver system as recited in claim 16, wherein said rail follower is moveable in a vertical direction perpendicular to said front-to-back direction due to an actuating device extending in an oblique direction relative to both said front-to-back direction and a vertical direction.

19. A transceiver assembly for electrically connecting to conductive pads of a host circuit board, comprising:
   a housing structure having a head portion and a body portion, the heading portion having a connector interfacing opening, the body portion having a pair of guiding features on two opposite sides thereof, the guiding features extending along a front-to-back direction perpendicular to a vertical direction;
   an electrical connector mounted to the body portion for detachably mechanically and electrically connecting to corresponding conductive pads of the host circuit board in said vertical direction; and
   a module circuit board disposed inside the housing and electrically connected to the electrical connector.

20. The transceiver assembly as claimed in claim 19, wherein the electrical connector is an LGA (Land Grid Array) connector with deflectable contacts.

\* \* \* \* \*